United States Patent
Laven et al.

(10) Patent No.: US 9,105,679 B2
(45) Date of Patent: Aug. 11, 2015

(54) SEMICONDUCTOR DEVICE AND INSULATED GATE BIPOLAR TRANSISTOR WITH BARRIER REGIONS

(71) Applicant: Infineon Technologies AG, Neubiberg (DE)

(72) Inventors: Johannes Georg Laven, Taufkirchen (DE); Roman Baburske, Otterfing (DE); Christian Jaeger, Munich (DE)

(73) Assignee: Infineon Technologies AG, Neubiberg (DE)

( * ) Notice: Subject to any disclaimer, the term of this patent is extended or adjusted under 35 U.S.C. 154(b) by 36 days.

(21) Appl. No.: 14/091,955

(22) Filed: Nov. 27, 2013

(65) Prior Publication Data

US 2015/0144988 A1     May 28, 2015

(51) Int. Cl.
   *H01L 29/739*     (2006.01)
   *H01L 29/10*     (2006.01)
   *H01L 29/861*     (2006.01)

(52) U.S. Cl.
   CPC ........ *H01L 29/7397* (2013.01); *H01L 29/1095* (2013.01); *H01L 29/8611* (2013.01)

(58) Field of Classification Search
   CPC ..................... H01L 29/7397; H01L 29/66348; H01L 29/0834; H01L 29/66356
   USPC .................................. 257/367, 566, 592, 593
   See application file for complete search history.

(56) References Cited

U.S. PATENT DOCUMENTS

| | | | |
|---|---|---|---|
| 4,893,160 A | 1/1990 | Blanchard | |
| 4,985,741 A | 1/1991 | Bauer et al. | |
| 5,751,024 A * | 5/1998 | Takahashi | ..................... 257/139 |
| 5,973,160 A | 10/1999 | Poss et al. | |
| 6,218,217 B1 | 4/2001 | Uenishi et al. | |
| 6,521,538 B2 | 2/2003 | Soga et al. | |
| 6,566,691 B1 | 5/2003 | Inoue et al. | |
| 6,710,403 B2 | 3/2004 | Sapp | |
| 6,750,508 B2 | 6/2004 | Omura et al. | |
| 6,800,897 B2 | 10/2004 | Baliga | |
| 6,882,004 B2 | 4/2005 | Zundel et al. | |
| 7,041,559 B2 | 5/2006 | Baliga | |

(Continued)

FOREIGN PATENT DOCUMENTS

| | | | |
|---|---|---|---|
| DE | 102004057791 A1 | 6/2006 | |
| DE | 102006049043 B4 | 3/2011 | |

(Continued)

OTHER PUBLICATIONS

Blank, O., "Semiconductor Device Including a Gate Trench and a Source Trench," U.S. Appl. No. 13/856,689, filed Apr. 4, 2013.

(Continued)

*Primary Examiner* — George Fourson, III

(74) *Attorney, Agent, or Firm* — Murphy, Bilak & Homiller, PLLC

(57) ABSTRACT

In a semiconductor device a barrier region is sandwiched between a drift region and a charge carrier transfer region. The barrier and charge carrier transfer regions form a pn junction. The barrier and drift regions form a homojunction. A mean impurity concentration in the barrier region is at least ten times as high as an impurity concentration in the drift region. A control structure is arranged to form an inversion layer in the drift and barrier regions in an inversion state. No inversion layer is formed in the drift and barrier regions in a non-inversion state.

20 Claims, 20 Drawing Sheets

(56) References Cited

U.S. PATENT DOCUMENTS

| | | |
|---|---|---|
| 7,078,740 B2 | 7/2006 | Yamaguchi et al. |
| 7,423,316 B2 | 9/2008 | Kawaji et al. |
| 7,456,487 B2 | 11/2008 | Ogura et al. |
| 7,546,487 B2 | 6/2009 | Marisetty et al. |
| 7,675,113 B2 * | 3/2010 | Sakamoto et al. ............ 257/330 |
| 7,986,003 B2 | 7/2011 | Aono et al. |
| 8,120,074 B2 | 2/2012 | Schulze et al. |
| 8,178,701 B2 | 5/2012 | Selifonov |
| 8,222,681 B2 | 7/2012 | Schulze et al. |
| 8,299,539 B2 | 10/2012 | Kouno |
| 8,319,314 B2 | 11/2012 | Ogura et al. |
| 2002/0179976 A1 * | 12/2002 | Takahashi .................... 257/370 |
| 2004/0014451 A1 | 1/2004 | Sapp et al. |
| 2004/0079989 A1 * | 4/2004 | Kaneko et al. ................ 257/328 |
| 2004/0173813 A1 * | 9/2004 | Chang .......................... 257/107 |
| 2006/0060916 A1 | 3/2006 | Girdhar et al. |
| 2007/0194374 A1 | 8/2007 | Bhalla et al. |
| 2007/0272978 A1 | 11/2007 | Mauder et al. |
| 2008/0179662 A1 | 7/2008 | Hshieh |
| 2008/0265315 A1 | 10/2008 | Mauder et al. |
| 2009/0140327 A1 | 6/2009 | Hirao et al. |
| 2010/0078707 A1 | 4/2010 | Haeberlen et al. |
| 2010/0193796 A1 | 8/2010 | Nakano |
| 2010/0289032 A1 | 11/2010 | Zhang et al. |
| 2011/0101416 A1 | 5/2011 | Schulze et al. |
| 2011/0248340 A1 | 10/2011 | Hsieh |
| 2011/0298056 A1 | 12/2011 | Ning et al. |
| 2011/0316074 A1 | 12/2011 | Oota |
| 2012/0032258 A1 | 2/2012 | Zeng et al. |
| 2012/0056241 A1 | 3/2012 | Sumitomo et al. |
| 2012/0098030 A1 | 4/2012 | Schulze et al. |
| 2012/0313139 A1 | 12/2012 | Matsuura et al. |
| 2014/0061719 A1 | 3/2014 | Takei |

FOREIGN PATENT DOCUMENTS

| | | |
|---|---|---|
| DE | 102005052734 B4 | 2/2012 |
| EP | 0881692 A2 | 12/1998 |
| EP | 1353385 A1 | 10/2003 |

OTHER PUBLICATIONS

Laven, J G. et al., "Semiconductor Device with Cell Trench Structures and Contacts and Method of Manufacturing a Semiconductor Device", U.S. Appl. No. 13/963,312, filed Aug. 9, 2013.

Laven, J. G. et al., "Insulated Gate Bipolar Transistor with Mesa Sections Between Cell Trench Structures and Method of Manufacturing", U.S. Appl. No. 14/026,383, filed Sep. 13, 2013.

Nakano, H et al., "600V trench-gate IGBT with Micro-P structure", 21st International Symposium on Power Semiconductor Devices & IC's, Jun. 14-18, 2009, pp. 132-135, Barcelona.

Sumitomo, M. et al., "Low loss IGBT with Partially Narrow Mesa Structure (PNM-IGBT)", Proceedings of the 2012 24th International Symposium on Power Semiconductor Devices and ICs, Jun. 3-7, 2012, pp. 17-20, Bruges.

Sumitomo, et al. "Injection Control Technique for High Speed Switching with a double gate PNM-IGBT." Proceedings of the 25th International Symposium on Power Semiconductor Devices & ICs, Kanazawa. IEEE, May 2013. pp. 33-36.

* cited by examiner

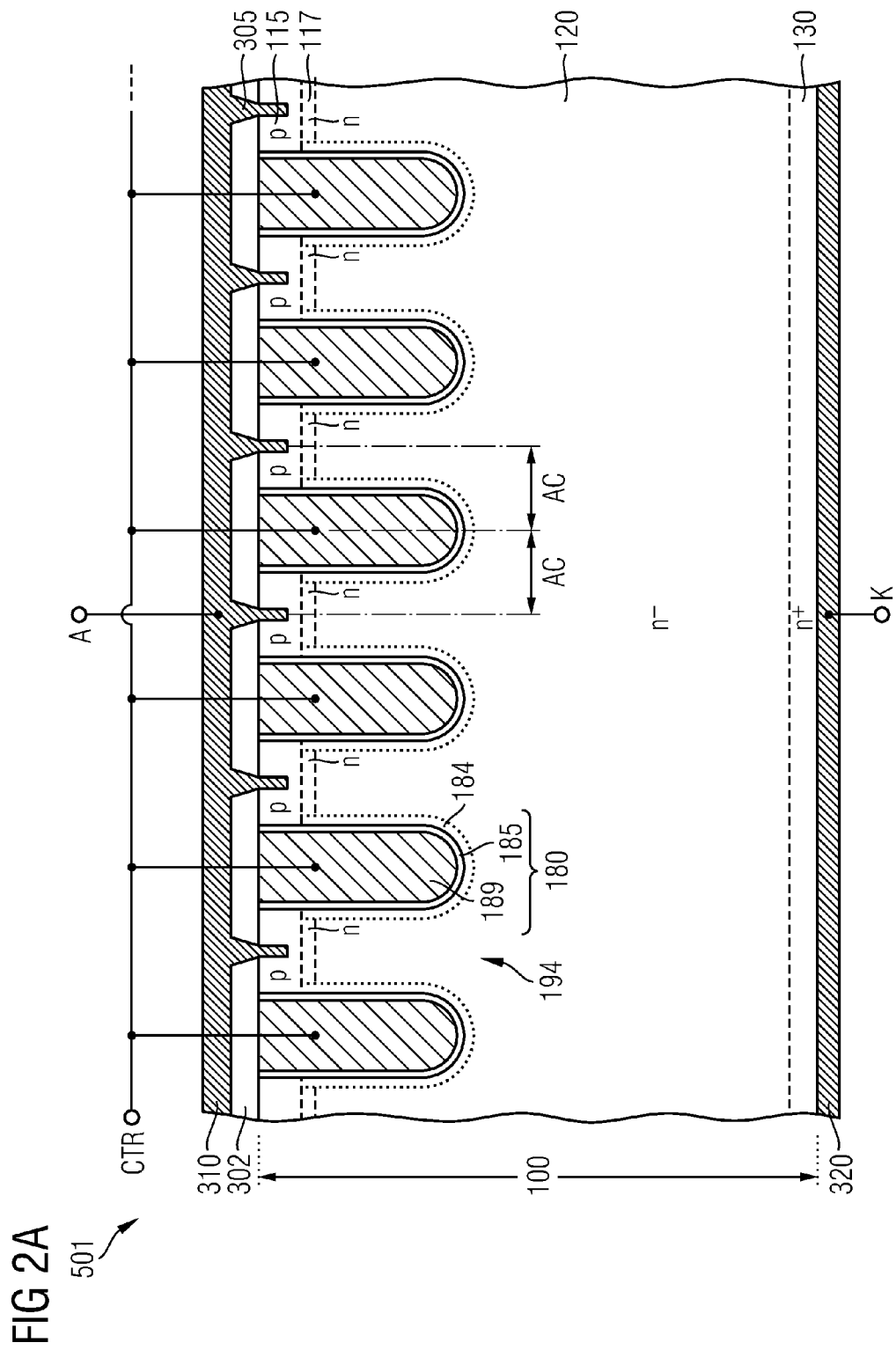

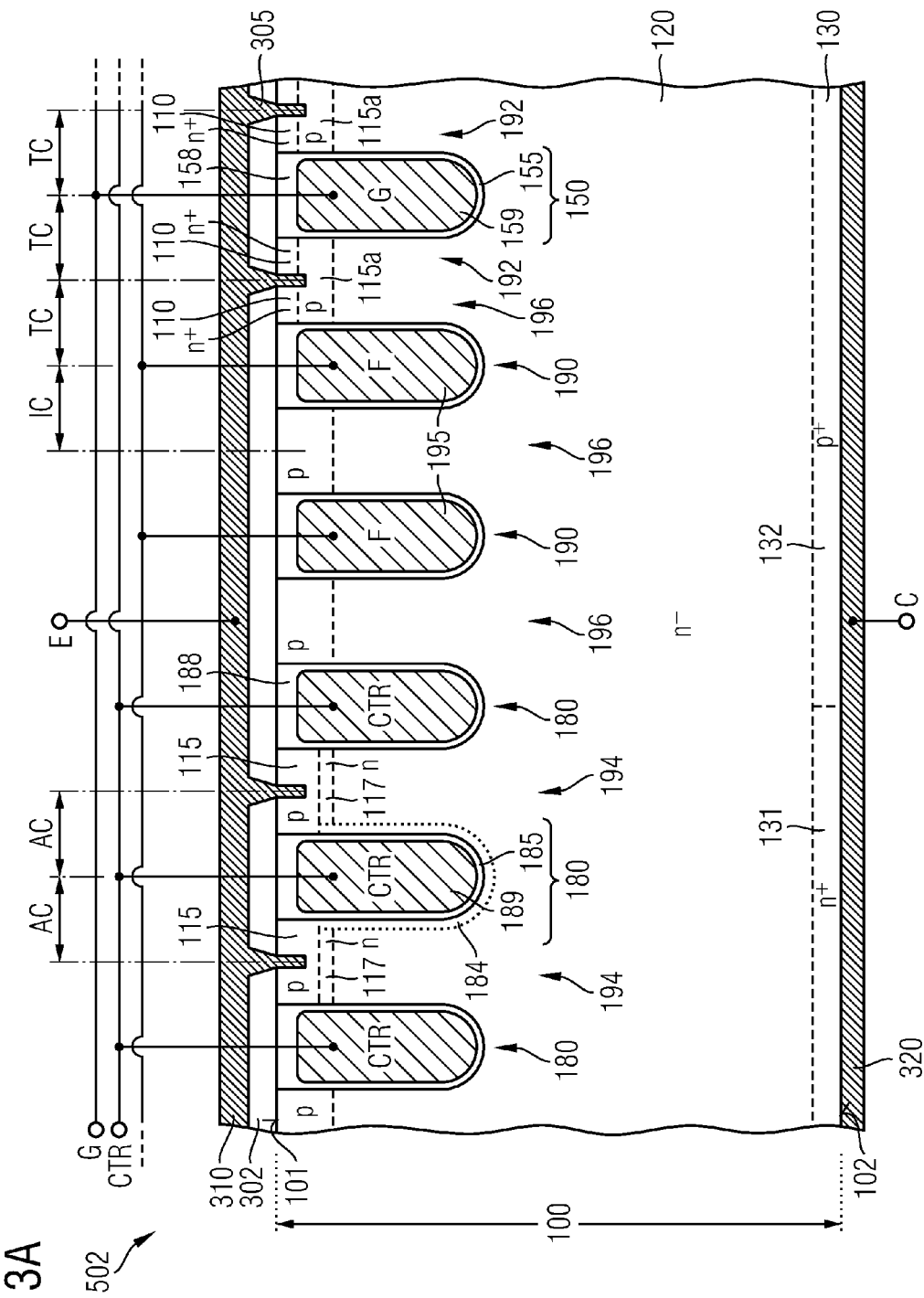

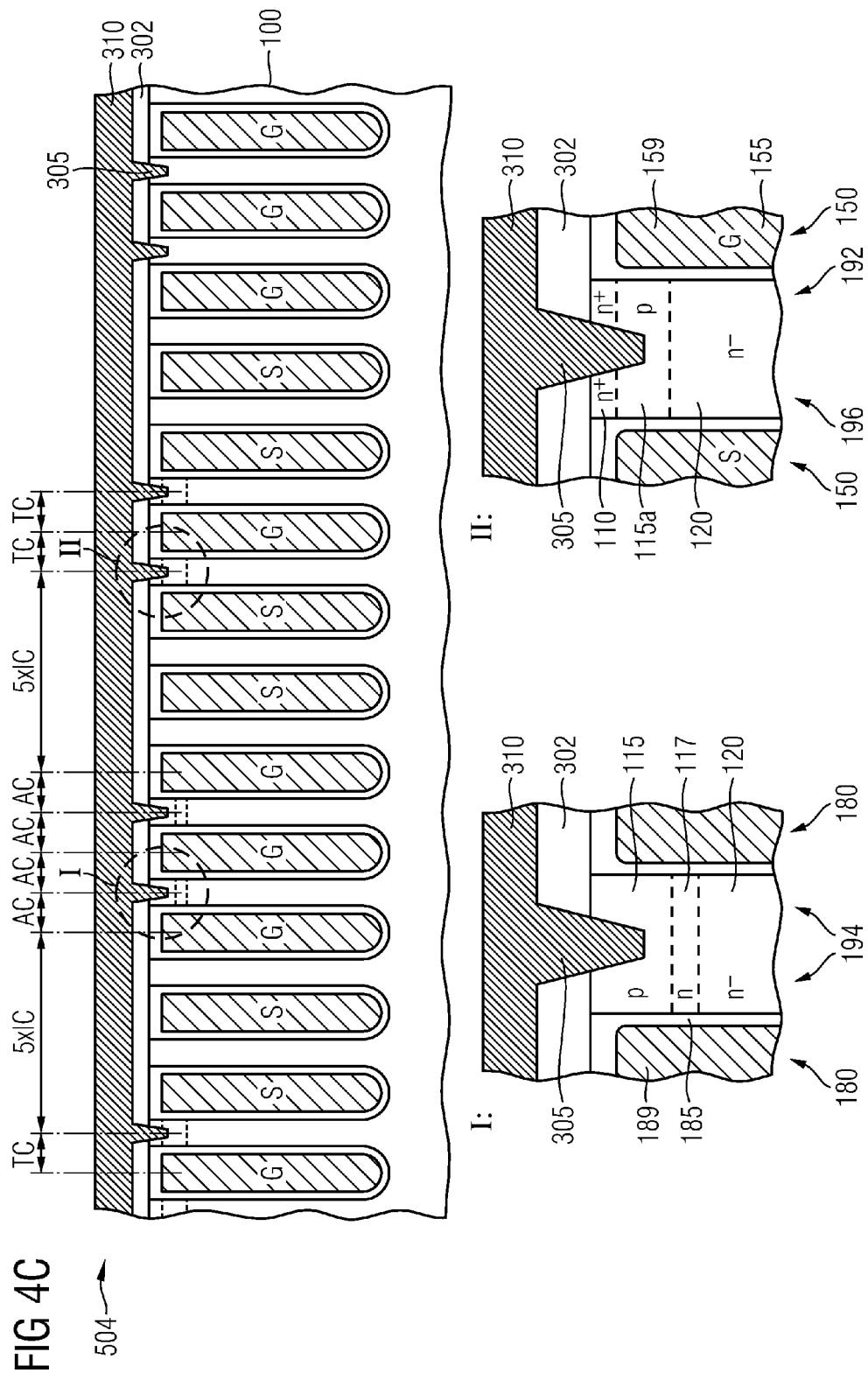

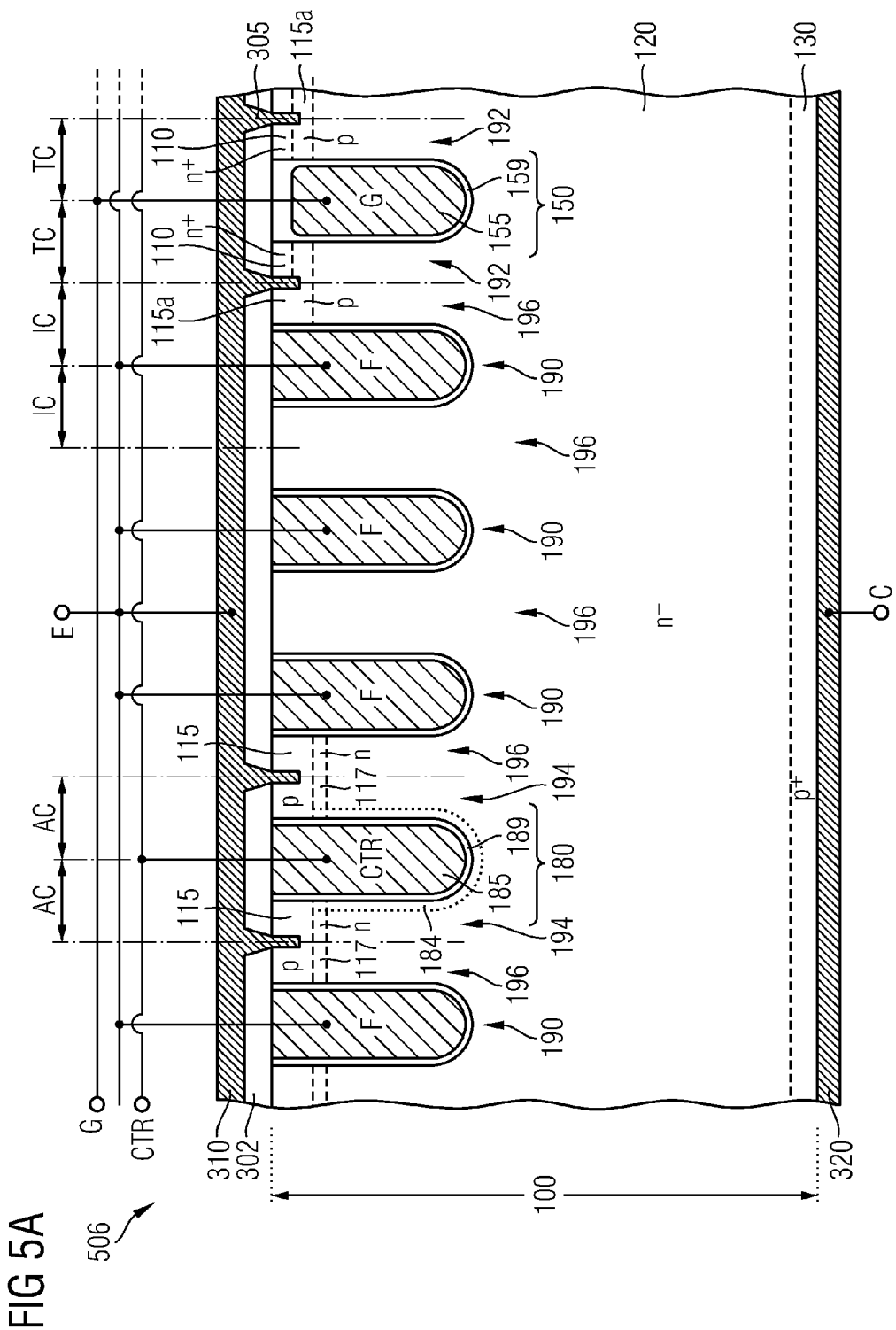

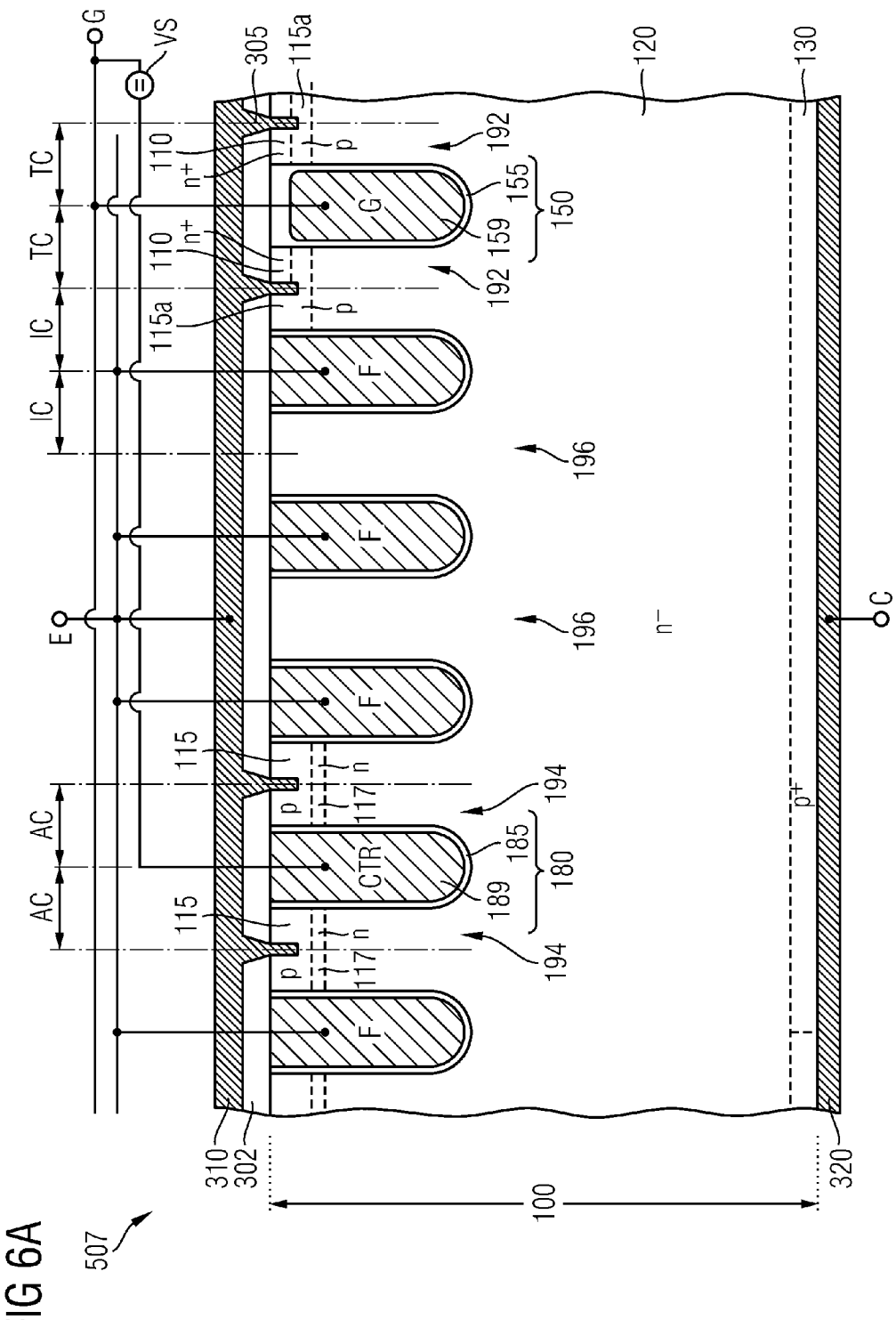

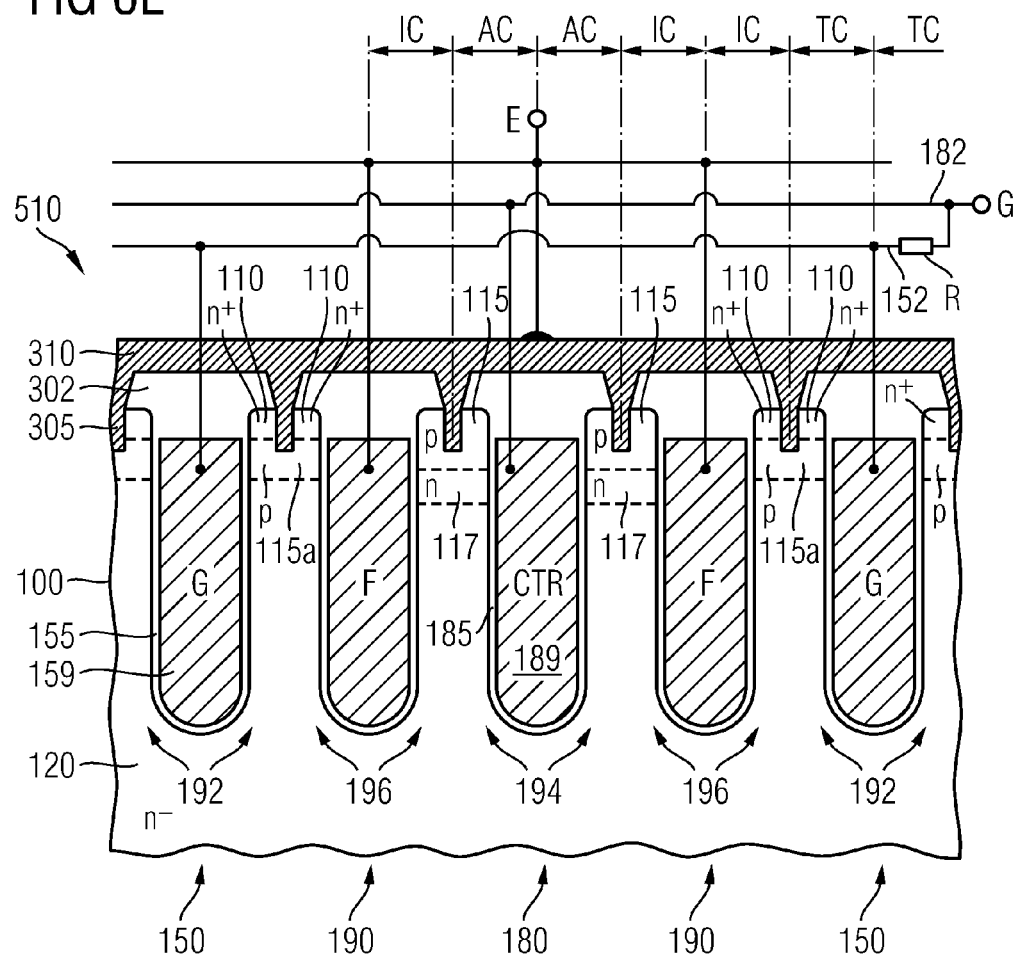

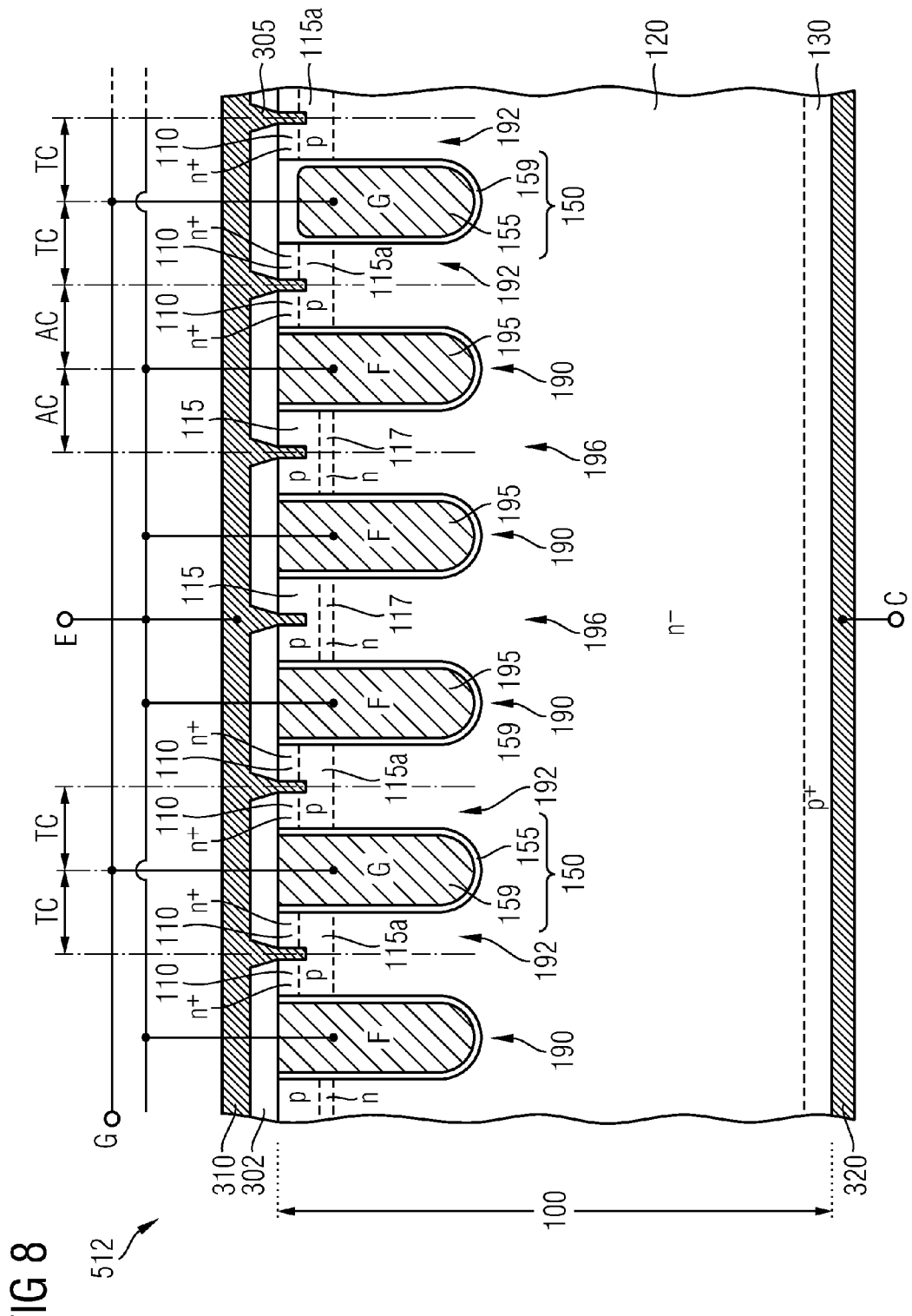

US 9,105,679 B2

SEMICONDUCTOR DEVICE AND INSULATED GATE BIPOLAR TRANSISTOR WITH BARRIER REGIONS

BACKGROUND

In semiconductor devices like semiconductor diodes and IGBTs (insulated gate bipolar transistors) mobile charge carriers flood the semiconductor regions on both sides of a forward biased pn junction and may form a charge carrier plasma that provides a low forward or on state resistance of the semiconductor device but that has to be removed in a reverse recovery period when the pn junction changes from forward biased to reverse biased. The reverse recovery process contributes to the dynamic switching losses of the semiconductor device. A desaturation cycle partly removes the charge carrier plasma before switching the pn junction from forward biased to reverse biased to reduce the dynamic switching losses. It is desirable to provide semiconductor devices with improved switching characteristics.

SUMMARY

An embodiment refers to a semiconductor device including a barrier region sandwiched between a drift region and a charge carrier transfer region. The barrier and charge carrier transfer regions form a pn junction. The barrier and drift regions form a homojunction. A mean impurity concentration in the barrier region is at least ten times as high as an impurity concentration in the drift region. A control structure is arranged to form an inversion layer in the drift and barrier regions in an inversion state. No inversion layer is formed in the drift and barrier regions in a non-inversion state.

According to an embodiment an insulated gate bipolar transistor includes a transistor cell and an auxiliary cell. The auxiliary cell includes a barrier region sandwiched between the drift region and a charge carrier transfer region, wherein the barrier and charge carrier transfer regions form a pn junction and the barrier and drift regions form a homojunction. An impurity concentration in the barrier region is at least ten times as high as an impurity concentration in the drift region.

Another embodiment refers to a semiconductor diode comprising a control structure and a barrier region. The control structure extends from a first surface into a semiconductor body and includes a control electrode and a control dielectric between the semiconductor body on a first side and the control electrode at a second side opposite to the first side. The barrier region is sandwiched between a drift region and a charge carrier transfer region in the semiconductor body, wherein the barrier and charge carrier transfer regions form a pn junction and the barrier and drift regions form a homojunction. An impurity concentration in the barrier region is at least ten times as high as an impurity concentration in the drift region.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 2A is a schematic cross-sectional view of a portion of a semiconductor diode with controllable injection cells according to an embodiment.

FIG. 3A is a schematic cross-sectional view of a portion of an RC-IGBT (reverse conducting IGBT) with controllable injection cells according to an embodiment providing separated control of injection and transistor cells.

FIG. 4C is a schematic cross-sectional view of a portion of an RC-IGBT in accordance with an embodiment providing controllable injection cells as well as idle cells.

FIG. 5A is a schematic cross-sectional view of a portion of a non RC-IGBT according to another embodiment providing separate control of desaturation and transistor cells.

FIG. 6A is a schematic cross-sectional view of a portion of a non RC-IGBT according to another embodiment providing collective control of desaturation and transistor cells using a voltage shifter.

FIG. 6E is a schematic cross-sectional view of a portion of a non RC-IGBT with collectively controlled desaturation and transistor cells as well as a low-pass circuit.

FIG. 8 is a cross-sectional view of a portion of an IGBT in accordance with embodiments providing uncontrolled auxiliary cells.

DETAILED DESCRIPTION

Figure 1:
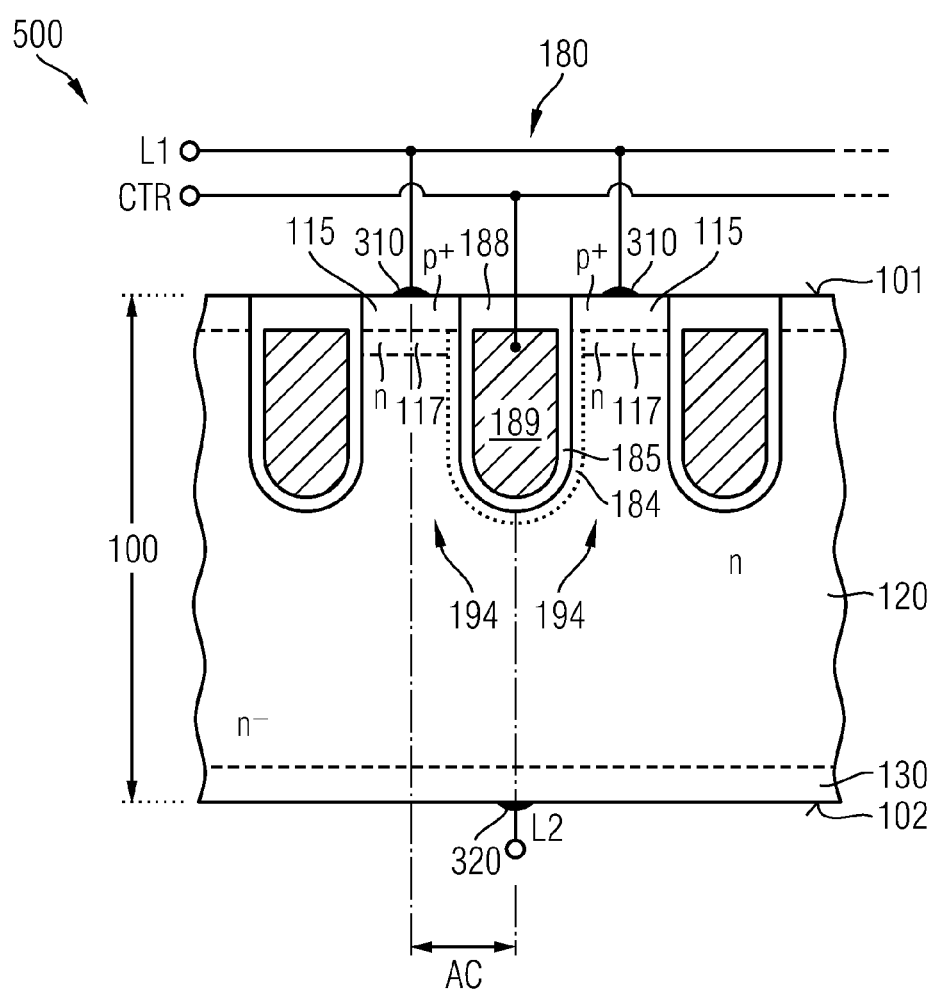
FIG. 1 is a schematic cross-sectional view of a portion of a semiconductor device in accordance with embodiments related to controllable auxiliary cells.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

FIG. 1A shows a portion of a semiconductor device 500 that may be a semiconductor diode or an IGBT, for example an RB-IGBT (reverse blocking IGBT) or an RC-IGBT (reverse conducting IGBT). A semiconductor body 100 of the semiconductor device 500 is provided from a single crystalline semiconductor material, for example silicon (Si), silicon carbide (SiC), germanium (Ge), a silicon germanium crystal (SiGe), gallium nitride (GaN) or gallium arsenide (GaAs) by way of example.

The semiconductor body 100 has a first surface 101, which may be approximately planar or which may be given by a plane spanned by coplanar surface sections, as well as a mainly planar second surface 102 parallel to the first surface 101. A minimum distance between the first and second surfaces 101, 102 is selected to achieve a specified voltage blocking capability of the semiconductor device 500. For example, the distance between the first and second surfaces 101, 102 may be 90 µm to 110 µm for an IGBT specified for a blocking voltage of about 1200 V. Other embodiments related to PT-IGBTs (punch through IGBTs) or IGBTs with high blocking capabilities may provide semiconductor bodies 100 with a thickness of several 100 µm.

In a plane perpendicular to the cross-sectional plane the semiconductor body 100 may have a rectangular shape with an edge length in the range of several millimeters. A normal to the first surface 101 defines a vertical direction and directions orthogonal to the vertical direction are lateral directions.

The semiconductor body 100 includes a drift region 120 of a first conductivity type, a charge carrier transfer region 115 of a second conductivity type, which is opposite to the first conductivity type, between the first surface 101 and the drift region 120 as well as a pedestal layer 130 between the drift region 120 and the second surface 102.

For the illustrated embodiments the first conductivity type is n-type and the second conductivity type is p-type. Similar considerations as outlined below apply to embodiments with the first conductivity type being p-type and the second conductivity type being n-type.

An impurity concentration in the drift region 120 may gradually or in steps increase or decrease with increasing distance to the first surface 101 at least in portions of its vertical extension. According to other embodiments the impurity concentration in the drift region 120 may be approximately uniform. A mean impurity concentration in the drift region 120 may be between $1 \times 10^{12}$ (1E12) cm$^{-3}$ and $1 \times 10^{15}$ (1E15) cm$^{-3}$, for example in a range from $5 \times 10^{12}$ (5E12) cm$^{-3}$ to $5 \times 10^{13}$ (5E13) cm$^{-3}$.

The pedestal layer 130 may have the first conductivity type in case the semiconductor device 500 is a semiconductor diode, the second conductivity type in case the semiconductor device 500 is a non RC-IGBT, or may include zones of both conductivity types extending between the drift region 120 and the second surface 102 in case the semiconductor device 500 is an RC-IGBT. A mean impurity concentration for a p-type pedestal layer 130 or p-type zones of the pedestal layer 130 may be at least $1\times10^{16}$ (1E16) cm$^{-3}$, for example at least $5\times10^{17}$ (5E17) cm$^3$.

The charge carrier transfer region 115 may directly adjoin the first surface 101. According to the illustrated embodiment, the charge carrier transfer region 115 may be formed on top of an auxiliary mesa section 194, wherein each auxiliary mesa section 194 directly adjoins a control structure 180.

A barrier region 117 sandwiched between the charge carrier transfer region 115 and the drift region 120 forms a pn junction with the charge carrier transfer region 115 and a homojunction with the drift region 120. The barrier region 117 has the first conductivity type. A mean impurity concentration in the barrier region 117 is at least ten times as high as a mean impurity concentration in the drift region 120. According to an embodiment, the mean impurity concentration in the barrier region 117 may range from $1\times10^{16}$ (1E16) cm$^{-3}$ to $1\times10^{18}$ (1E18) cm$^{-3}$, for example from $1\times10^{17}$ (1E17) to $5\times10^{17}$ (5E17) cm$^{-3}$. The impurities may be phosphorus (P), arsenic (As), selenium (Se) and/or sulfur (S) atoms/ions.

When the pn junction between the charge carrier transfer region 115 and the barrier region 117 is forward biased the charge carrier transfer region 115 injects majority-type charge carriers through the barrier region 117 into the drift region 120. In case of a semiconductor diode, the charge carrier transfer region 115 is effective as an anode region connected to an anode electrode. For RC-IGBTs the charge carrier transfer region 115 is effective as the anode region of the reverse diode. In case of non RC-IGBTs the charge carrier transfer region 115 supports extraction of charge carriers from the drift region 120 in a desaturation period.

The control structure 180 may extend from the first surface 101 into the semiconductor body 100 at least down to the drift region 120. According to the illustrated embodiment the control structure 180 extends into the drift region 120. The control structure 180 may include a conductive control electrode 189 and a control dielectric 185 separating the control electrode 189 from the semiconductor body 100. The control dielectric 185 is formed between the barrier region 117 and the drift region 120 on the one side and the control electrode 189 on the other side.

The control dielectric 185 may have a uniform thickness. According to other embodiments, a bottom portion of the control dielectric 185 oriented to the second surface 102 may be thicker than a top portion oriented to the first surface 101. According to further embodiments the control structure 180 may include a field electrode of a conductive material. The field electrode is dielectrically insulated from the gate electrode 189 and arranged between the gate electrode 189 and the second surface 102. A field electrode or a thick control dielectric along the drift region 120 may reduce a capacitive coupling between the drift region 120 and the control electrode 189 and stabilizes the potential applied to the control electrode 189.

The control electrode 189 may be a homogenous structure or may have a layered structure including one or more metal containing layers. According to an embodiment the control electrode 189 may include or consist of a heavily doped polycrystalline silicon layer.

The control dielectric 185 may include or consist of a semiconductor oxide, for example thermally grown or deposited silicon oxide, a semiconductor nitride, for example deposited or thermally grown silicon nitride, or a semiconductor oxynitride, for example silicon oxynitride.

The semiconductor device 500 may be arranged not to form, in the charge carrier transfer region 115, an inversion layer through which minority charge carriers flow between the drift region 120 and a load electrode when a positive voltage is applied to the control electrode 189.

According to an embodiment, a top dielectric 188 may extend between the first surface 101 and the control electrode 189 such that the control electrode 189 does not sufficiently overlap with the charge carrier transfer region 115 along the vertical direction to form a continuous inversion channel through the charge carrier transfer region 115.

According to another embodiment, the charge carrier transfer region 115 may directly adjoin the control structure 180 at the first surface 101 such that the auxiliary mesa section 194 is devoid of a region of the first conductivity type between the first surface 101 and the charge carrier transfer region 115 at least along the control structure 180.

According to a further embodiment a dielectric structure may be provided on the first surface 101 on both sides of the vertical projection of the interface between the charge carrier transfer region 115 and the control structure 180.

In the illustrated embodiment both the lacking overlap between the control electrode 185 and the charge carrier transfer region 115 and the lack of a region of the first conductivity type along the first surface 101 at the outer edge of the control structure 180 inhibit an electron path through the charge carrier transfer region 115.

A distance between the first surface 101 and a bottom of the control structures 180 may range from 1 μm to 30 μm, e.g. from 3 μm to 7 μm. A lateral width of the auxiliary mesa sections 194 may range from 0.05 μm to 10 μm, e.g. from 0.15 μm to 1 μm. A distance between the first surface 101 and the pn junction between barrier region 117 and charge carrier transfer region 115 may range from 0.5 μm to 5 μm, e.g. from 1 μm to 1.5 μm.

The barrier region 117 may or may not include a lower doped portion having an impurity concentration of the drift region 120 on the side oriented to the charge carrier transfer region 115.

A total impurity quantity (effective anode dose) in the charge carrier transfer region 115 is set such that it prevents a depletion region extending from the pn junction between the charge carrier transfer region 115 and the barrier region 117 from reaching the first surface 101 or a contact structure that extends from the first surface 101 into the semiconductor body 100 at the operation conditions the semiconductor device 500 is specified for. For example, the total impurity quantity in the charge carrier transfer region 115 may be the result of a p-type implant dose of about $5\times10^{12}$ (5E12) cm$^{-2}$ and a following etch of contact grooves that removes portions of the implanted areas.

A first load electrode 310, which may be, e.g., an anode electrode of a semiconductor diode or an emitter electrode of an IGBT, is electrically connected with the charge carrier transfer regions 115. The first load electrode 310 may be or may be electrically coupled or connected to a first load terminal L1, for example the anode terminal of a semiconductor diode or the emitter terminal of an IGBT. The control electrode 189 may be electrically connected or coupled to a control terminal CTR or electrically connected or coupled to a gate terminal of the semiconductor device 500.

A second load electrode 320 directly adjoins the second surface 102 and the pedestal layer 130. The second load electrode 320 may be or may be electrically connected to a second load terminal L2, which may be the cathode terminal of a semiconductor diode or the collector terminal of an IGBT.

Each of the first and second load electrodes 310, 320 may consist of or contain, as main constituent(s) aluminum (Al), copper (Cu), or alloys of aluminum or copper, for example AlSi, AlCu or AlSiCu. According to other embodiments, at least one of the first and second load electrodes 310, 320 may contain, as main constituent(s), nickel (Ni), titanium (Ti), tungsten (W), tantalum (Ta), silver (Ag), gold (Au), platinum (Pt), and/or palladium (Pd). For example, at least one of the first and second load electrodes 310, 320 may include two or more sub-layers, wherein each sub-layer contains one or more of Ni, Ti, Ag, Au, Pt, W, and Pd as main constituent(s), e.g., a silicide, a nitride and/or an alloy.

A half of a control structure 180 and an adjoining auxiliary mesa section 194 including the charge carrier transfer and barrier regions 115, 117 form an auxiliary cell AC. A plurality of auxiliary cells AC may be arranged along a lateral direction with the auxiliary cells AC having the same orientation. According to other embodiments, the auxiliary cells AC are arranged in pairs, wherein the auxiliary cells AC of each pair are arranged mirror-inverted to each other along a vertical axis which may be an axis through the control structure 180 or through the auxiliary mesa sections 194. The semiconductor body 100 may or may not include other cell types, for example transistor cells or idle cells.

For semiconductor diodes and RC-IGBTs the auxiliary cells AC are controlled to form an inversion layer 184 in the drift and barrier regions 120, 117 in an inversion state and to form no inversion layer in the drift and barrier regions 120, 117 in a non-inversion state. The inversion layer 184 increases the effective anode emitter area and hence the anode emitter efficiency in a forward conducting mode of a semiconductor diode or the reverse conducting mode (diode mode) of an RC-IGBT including an integrated free-wheeling diode.

By switching on and off the inversion layer 184 the control structure 180 allows the semiconductor device 500 to change in-situ between a low-frequency mode with comparatively low static losses and high dynamic switching losses and a high-frequency mode with high static losses and low dynamic switching losses.

Alternatively or in addition, the non-inversion state can be used to de-saturate a semiconductor device before reverse biasing a forward-biased pn junction of a semiconductor diode or the forward-biased pn junction of a freewheeling diode of an RC-IGBT.

The effective anode efficiency in the non-inversion state is given by the effective anode dose in the charge carrier transfer region 115. The effective anode efficiency in the inversion state is given by the sum of the effective anode dose of the charge carrier transfer region 115 and the anode efficiency of the p-type inversion layer accumulating holes. As a consequence, a lower effective anode dose allows a wider spread of the anode emitter efficiency between the inversion state and the non-inversion state. A wide spread or difference between the anode emitter efficiency in the inversion state and the anode emitter efficiency in the non-inversion state allows a better tradeoff between dynamic and static switching losses and/or provides a more effective desaturation cycle.

The barrier region 117 virtually reduces the effective anode dose and hence the anode emitter efficiency without reducing the actual impurity dose within the charge carrier transfer region 115. In contrast to other methods for reducing the effective anode dose, for example by over-etching a contact hole into the charge carrier transfer region 115 after implantation or by a significantly reduced peak impurity concentration in the charge carrier transfer region 115, which both are difficult to control, the formation of the barrier region 117 is comparatively simple and less delicate. In addition, the barrier region 117 may increase the ruggedness against critical current filamentation events in the semiconductor body 100.

According to embodiments related to non RC-IGBTs, the auxiliary cells AC may be operated as desaturation cells actively draining off charge carriers from the drift region 120 through the first load electrodes 310 prior to a turn-off signal applied to the gate electrode of an RB- or RC-IGBT in forward operation.

The semiconductor device 500 may be arranged not to form an inversion path through the charge carrier transfer region 115. For example, the control electrode 180 is not connected to a network node to which a signal is applied that exceeds a threshold voltage for formation of an n-type inversion layer in the p-type charge carrier transfer region 115. Alternatively, the top dielectric 188 may overlap with the charge carrier transfer region 115 along the vertical direction or the auxiliary mesa section 194 is devoid of a source region between the first surface 101 and the charge carrier transfer region 115.

The semiconductor diode 501 of FIG. 2A refers to embodiments with controllable anode emitter efficiency. The semiconductor diode 501 is based on the semiconductor device 500 of FIG. 1, wherein the first load electrode 310 forms an anode electrode that forms or is electrically connected to an anode terminal A.

Contacts 305 extending through openings of a dielectric structure 302 electrically connect the first load electrode 310 with the charge carrier transfer regions 115. The pedestal layer 130 has the first conductivity type and forms a homo-junction with the drift region 120. The second load electrode 320 forms a cathode terminal K or is electrically connected to the cathode terminal K. The auxiliary cells AC may be arranged in pairs with the two auxiliary cells AC of each pair arranged mirror-inverted with respect to a center axis of the control structures 180. The control electrodes 189 are electrically connected to a control terminal CTR or to an output of an integrated control circuit supplying a control signal $U_{CTR}$. For further details, reference is made to the description of FIG. 1.

The control signal $U_{CTR}$ applied to the control electrodes 189 controls the anode emitter efficiency of the auxiliary cells AC, which are effective as injection cells in the forward mode of the semiconductor device 501. At voltages at the control electrodes 189 below a threshold voltage $V_{thAC}$ of the auxiliary cells AC p-type inversion layers 184 are formed along the control structures 180 in the barrier and drift regions 117, 120, wherein the inversion layers 184 increase the effective anode area and the anode emitter efficiency. Above the negative first threshold voltage $V_{thAC}$, no inversion layer is formed and the effective anode emitter area and the anode emitter efficiency are low. At least up to a second threshold voltage $V_{th}$ at which an n-type inversion layer may be formed in the charge carrier transfer regions 115, the semiconductor diode 501 maintains its full reverse blocking capabilities such that the semiconductor diode 501 can directly switch from a desaturation period within the forward conducting mode to a reverse blocking mode.

The barrier region 117 increases the spread or difference between the anode emitter efficiencies of the inversion state and the non-inversion state in a well-controllable way such that the efficiency of the desaturation period can be increased in a well-defined manner.

According to an embodiment, the barrier region 117 contains at least one deep level donor or deep double donor, e.g., sulfur and/or selenium atoms/ions. With deep level donors, the doping level increases with increasing temperature, wherein a locally increasing doping level locally reduces anode emitter efficiency and thus counteracts an inhomogeneous current distribution among parallel auxiliary cells.

Figure 2B:
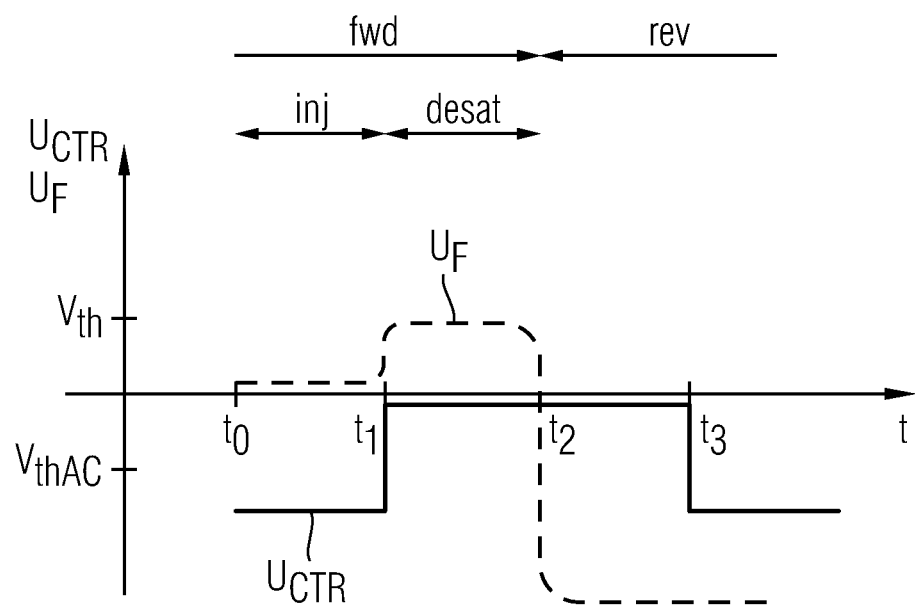
FIG. 2B is a schematic timing diagram illustrating a method of operating the semiconductor diode of FIG. 2A.

FIG. 2B shows a timing diagram of a control signal $U_{CTR}$ applied to the control electrodes 189, e.g., through the control terminal CTR. In an injection period between t0 and t1 the control signal $U_{CTR}$ is lower than the first threshold voltage $V_{thAC}$ such that p-type inversion layers 184 along the control structures 180 increase the effective anode area. A charge carrier plasma in the drift region 120 is high and the effective forward resistance as well as the forward voltage $U_F$ are low. During a desaturation period between t1 and t2, the voltage of the control signal $U_{CTR}$ is above the first threshold $V_{thAC}$ and may be below the second threshold voltage $V_{th}$. No inversion layers are formed and the effective anode emitter area is small. The charge carrier plasma is attenuated resulting in an increased forward voltage $U_F$.

When the semiconductor diode commutates and switches to the reverse blocking mode at t2, the reverse recovery charge is low and switching losses are reduced. Before the semiconductor diode 501 switches back to the forward biased mode, the control voltage $U_{CTR}$ can be decreased to below the first threshold voltage $V_{thAC}$ at t3 during the reverse blocking mode.

Compared to approaches aiming at reducing the effective anode dose for providing a high spread between the high and low anode emitter efficiency states, the barrier region 117 allows for higher anode doses which are easier to control during manufacture.

The RC-IGBT 502 in FIG. 3A includes controllable auxiliary cells AC as described with reference to FIGS. 1 and 2A, wherein the first load terminal 310 is electrically connected to an emitter terminal E, the second load terminal 320 is electrically connected to a collector terminal C and the pedestal layer 130 includes first zones 131 of the first conductivity type and second zones 132 of the second conductivity type, wherein the first and second zones 131, 132 are sandwiched between the drift region 120 and the second load electrode 320, respectively.

In addition to the auxiliary cells AC the RC-IGBT 502 includes transistor cells TC and may or may not include idle cells IC. Each transistor cell TC includes a transistor mesa section 192 of the semiconductor body 100 as well as a gate structure 150 extending from the first surface 101 into the semiconductor body 100. The gate structure 150 includes a conductive gate electrode 159 and a gate dielectric 155 insulating the gate electrode 159 from the surrounding material of the semiconductor body 100.

Shape and size of the gate structures 150 may correspond to, for example, may be equal to the shape and size of the control structures 180. The gate and control dielectrics 155, 185 may have the same thickness and may be provided from the same material(s). Lateral and vertical extensions of the gate electrodes 159, may be the same as those for the control electrodes 189. Gate and control electrodes 159, 189 may be provided from the same material(s). A gate top dielectric 158 may separate the gate electrode 159 from the first surface 101.

The transistor mesa section 192 includes a p-type body region 115a forming a pn junction with the drift region 120, wherein the body regions 115a may approximately correspond to the charge carrier transfer regions 115 of the auxiliary cells AC. For example, a mean impurity concentration and a vertical extension of the body regions 115a of the transistor cells TC may approximately correspond or may be equal to the mean impurity concentration and the vertical extension of the charge carrier transfer regions 115.

a. Each transistor cell TC includes a source region 110 in the transistor mesa section 192 between the top surface of the transistor mesa section 192 and the body region 115a at least in a portion of the transistor mesa section 192 that directly adjoins the gate structure 150 of the transistor cell TC. The transistor body regions 115a directly adjoin the drift region 120. The transistor mesa sections 192 may be devoid of a structure corresponding to the barrier region 117 of the auxiliary cells AC or may include a corresponding barrier region.

The semiconductor device 500 may further include idle cells IC including idle structures 190 which may correspond to the control structures 180 of the auxiliary cells AC and/or the gate structures 150 of the transistor cells TC. Idle mesa sections 196 adjoining the idle structures 190 may be devoid of regions corresponding to the charge carrier transfer and body regions 115, 115a, the source regions 110, and/or the barrier region 117. The idle mesa sections 196 may or may not be electrically connected to the first load electrode 310.

The control electrodes 180 of the auxiliary cells AC may be electrically connected to each other and to an output of an internal circuit or to a control terminal CTR of the RC-IGBT 502. The control electrodes 195 of the idle cells IC may be electrically connected or coupled to the control electrodes 180 of the auxiliary cells AC, to the gate electrodes 150 of the transistor cells TC, to the first load electrode 310 or to any other internal network node of the RC-IGBT 502.

The semiconductor device 502 is arranged not to form an inversion path through the charge carrier transfer region 115. For example, the control electrode 180 is not connected to a network node to which a signal is applied that exceeds a threshold voltage for formation of an n-type inversion layer in a p-type charge carrier transfer region 115. Alternatively, the top dielectric 188 may overlap with the charge carrier transfer region 115 along the vertical direction or the auxiliary mesa section 194 is devoid of a source region between the first surface 101 and the charge carrier transfer region 115.

The RC-IGBT 502 is in the forward mode when a positive collector-to-emitter voltage $U_{CE}$ is applied between the collector and emitter terminals C, E. If a voltage applied to the gate electrode 150 exceeds the threshold voltage $V_{th}$ for the transistor cells TC, an n-type inversion channel is formed through the body region 115a and a current flow through the body regions 115a opens the pnp bipolar junction transistor formed by the body region 115a, the drift region 120 and the p-type second zones 132 in the pedestal layer 130 in the forward conducting mode.

In the complementary forward blocking mode, the voltage applied to the gate electrode 150 is below the threshold voltage $V_{th}$ of the transistor cells TC and the reverse biased pn junction between the body and drift regions 115a, 120 accommodates the forward blocking voltage.

In the reverse conducting or diode mode a negative collector-to-emitter voltage $U_{CE}$ applied between the collector and emitter electrodes forward biases the pn junctions between the body and drift regions 115a, 120 as well as between the charge carrier transfer and drift regions 115, 120. During an injection period of the diode mode a negative voltage of the control signal $U_{CTR}$ below the first threshold voltage $V_{thAC}$ induces p-type inversion layers 184 in the barrier and drift regions 117, 120 along the control structures 180. The inversion layers 184 increase the active anode area and the total anode emitter efficiency.

In a subsequent desaturation period, the voltage of the control signal $U_{CTR}$ is higher than the first threshold voltage $V_{thAC}$ such that the total effective anode emitter efficiency is reduced. Desaturation is decoupled from a voltage applied to the gate electrodes 159. Commutating from the reverse conducting mode to the forward blocking mode can directly follow the desaturation period without any time lag between the end of the desaturation period and the start of the commutation.

By contrast, conventional approaches rely on a desaturation period applied to a gate electrode and inducing n-type inversion channels through the body regions 115a, wherein the n-type inversion channels short-circuit the p-type body and charge carrier transfer regions 115a, 115 to drastically reduce the total anode emitter efficiency. Since the n-type inversion channel prevents a transistor cell TC from accommodating a high blocking voltage in applications as, for example, half-bridge circuits, a sufficient time lag has to be provided between the end of the desaturation period and the start of the commutation. Since the charge carrier plasma at least partially restores during the time lag, the time lag deteriorates the overall desaturation performance.

Furthermore, in conventional RC-IGBTs some regions have to remain active as injecting charge carrier transfer regions during a desaturation period in order to maintain a minimum reverse conductivity even when the short-circuited body regions 115a do not inject any charges. Therefore, in conventional designs the anode efficiency of additional injecting regions has to be carefully tuned such that both the number of holes injected into the drift region 120 remains sufficiently high during the desaturation period and desaturation efficiency remains sufficiently high.

Current methods for reducing the anode efficiency in the injection regions aim at reducing the effective anode dose in the charge carrier transfer regions 115, for example by reducing the implant dose and/or removing portions of the charge carrier transfer regions 115 after the implant. However, reliably controlling a small anode dose has turned out to be a delicate process with low yield. Instead, the barrier regions 117 reduce the anode emitter efficiency of the auxiliary cells AC without reducing the effective anode dose in the charge carrier transfer regions 115, thereby avoiding critical processes with low yield.

In addition the barrier regions 117 provide a potential barrier for the holes in the charge carrier plasma and significantly reduce the negative impact of the auxiliary cells AC on the device performance in the IGBT mode.

The transistor cells TC may be provided with or without the barrier region 117 or any other region of the first conductivity type corresponding to the barrier region 117 in the auxiliary cells AC. According to an embodiment, the transistor cells TC may be devoid of the barrier region 117 or any similar region such that the transistor cells TC remain unaffected by the design of the auxiliary cells AC.

Figure 3B:
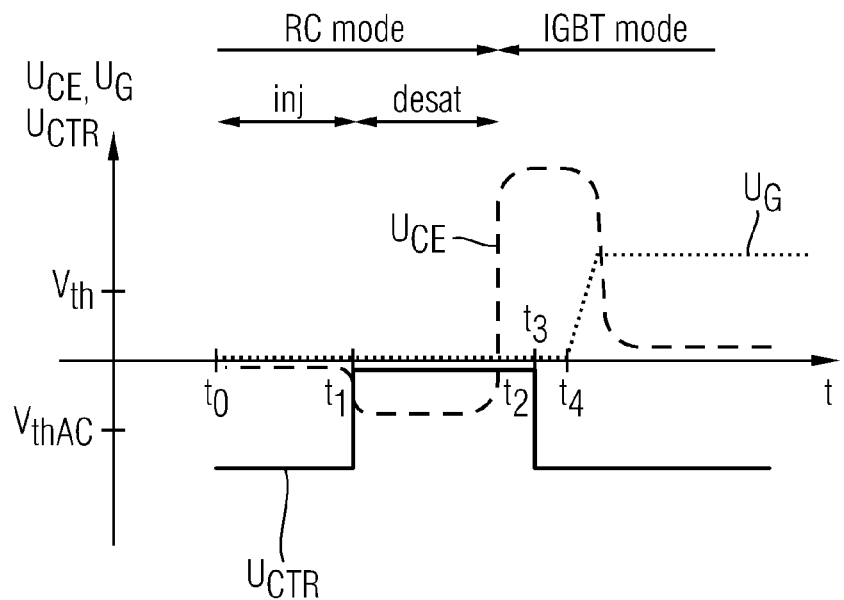
FIG. 3B is a schematic timing diagram illustrating a method of operating the RC-IGBT of FIG. 3A.

FIG. 3B schematically shows the transition from the injection to the desaturation period at t1 as well as the start of the commutation of the integrated free-wheeling diode with the change from the negative collector-to-emitter voltage $U_{CE}$ to a positive voltage $U_{CE}$ at t2. Opening the n-type channels in the transistor cells TC by applying a gate signal $U_G$ with a voltage higher than the threshold voltage $V_{th}$ of the transistor cells TC is decoupled from the desaturation period. At the start of the commutation no n-type inversion channel providing a charge carrier path exists even if the commutation overlaps the desaturation period.

Figure 4B:
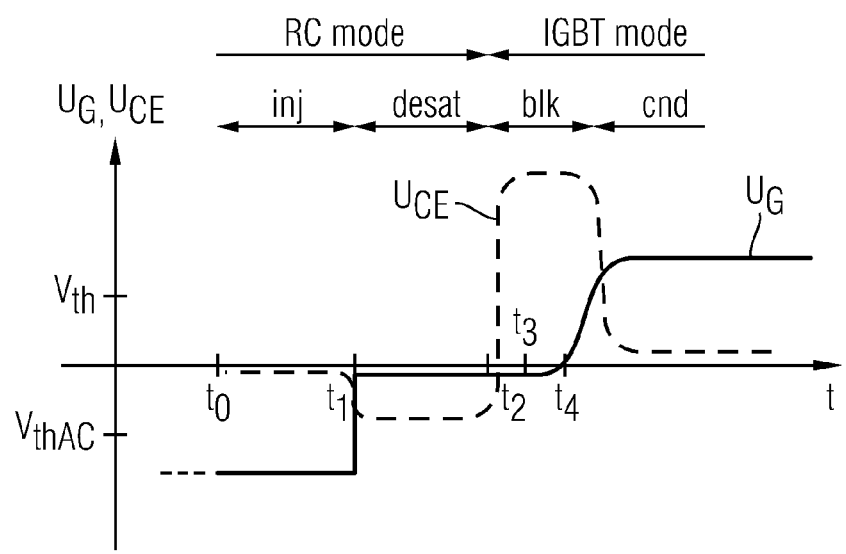
FIG. 4B is a schematic timing diagram illustrating a method of operating the RC-IGBT of FIG. 4A.
Figure 4A:
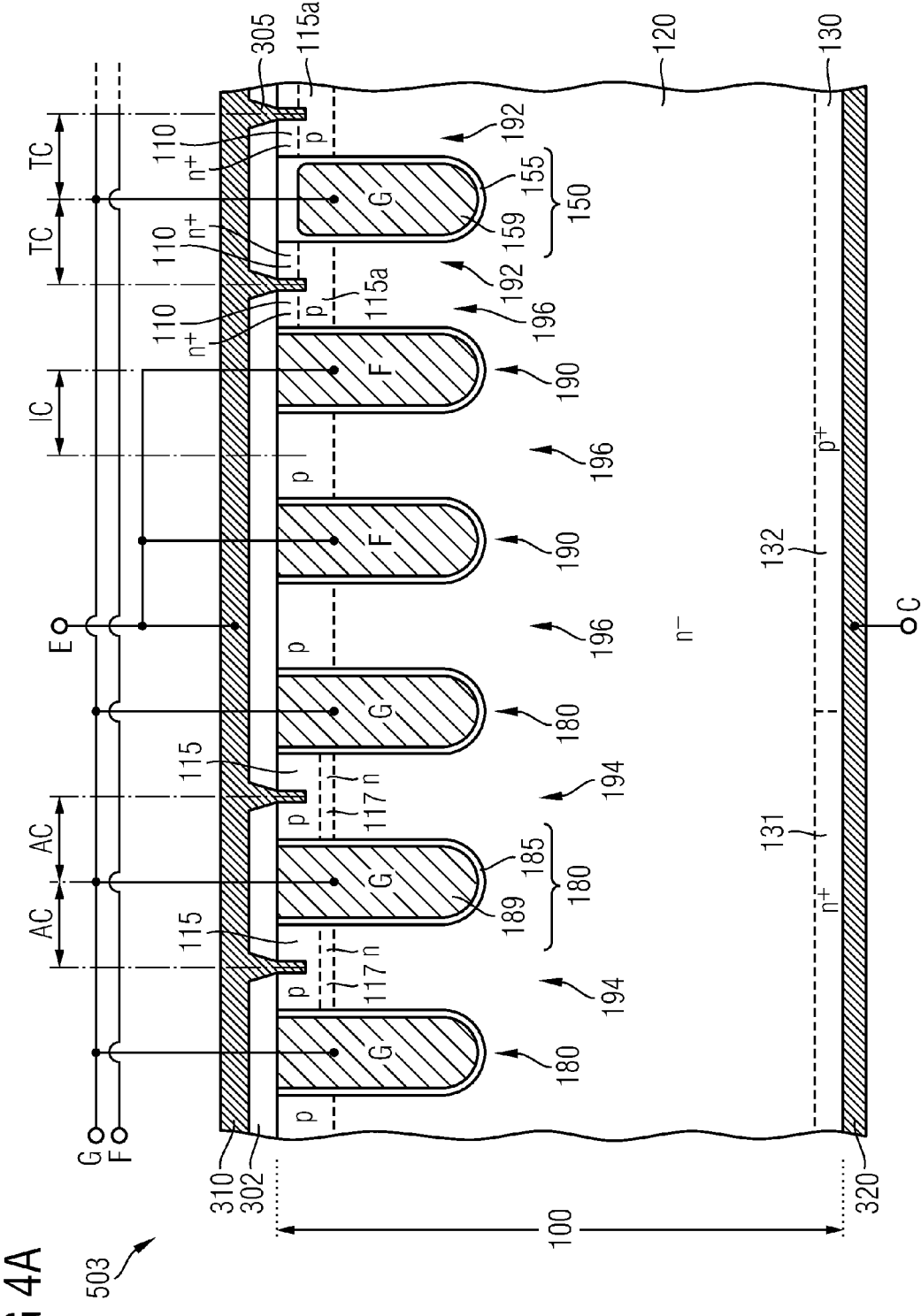
FIG. 4A is a schematic cross-sectional view of a portion of an RC-IGBT with controllable injection cells according to an embodiment providing collective control of injection and transistor cells.

The RC-IGBT 503 of FIG. 4A distinguishes from the RC-IGBT 502 of FIG. 3A in that the gate and control electrodes 150, 180 are electrically connected to each other. The gate and control electrodes 150, 180 may be electrically connected to a gate terminal G or to an internal network node of the RC-IGBT 503, for example to an output of a driver or delay circuit. The auxiliary cells AC are arranged not to form an inversion current path through the charge carrier transfer region 115 when a voltage of the gate signal $U_G$ applied to the gate and control electrodes 150, 180 exceeds the threshold voltage $V_{th}$ of the transistor cells TC. For example, a top dielectric between the first surface 101 and the control electrode 180 may overlap with the charge carrier transfer region 115 along the vertical direction or the auxiliary mesa section 194 is devoid of a source region between the first surface 101 and the charge carrier transfer region 115.

According to an embodiment, the barrier region 117 contains at least one deep level donor or deep double donor, e.g., sulfur (S) and/or selenium (Se) atoms/ions. With deep level donors, the doping level increases with increasing temperature, wherein the increasing doping level reduces anode emitter efficiency and thus counteracts an inhomogeneous current distribution among parallel auxiliary cells AC.

FIG. 4B shows a timing diagram illustrating a mode of operation of the RC-IGBT 503 of FIG. 4A. At a voltage of the gate signal $U_G$ below the first threshold voltage of the auxiliary cells $V_{thAC}$, for example, at $U_G=-15$ V, the effective anode area of the RC-IGBT 503 in the reverse conducting mode is significantly increased and the RC-IGBT 503 is in an injection mode.

At t1 the voltage of the gate signal $U_G$ is increased to above the threshold voltage $V_{thAC}$ of the auxiliary cells AC and below the threshold voltage $V_{th}$ of the transistor cells TC to start a desaturation period. Controlling the anode efficiency of the auxiliary cells AC at the desaturation voltage may achieve a significant effect for an ample range of a ratio of auxiliary cells AC to transistor cells TC, e.g., in a range from 1:10 to 10:1. The device retains its full reverse blocking capability during the desaturation. A time lag between the end of the desaturation period and the start of the commutation of the RC-IGBT 503 can be completely omitted without the risk of provoking a short-circuit condition. The omission of the time lag results in a highly effective desaturation.

FIG. 4C shows an RC-IGBT 504 with four auxiliary cells AC and ten idle cells IC per each two transistor cells TC. The auxiliary and transistor cells AC, TC are controlled by the same gate signal $U_G$. Idle electrodes of the idle control cells IC may be connected to the potential of the emitter electrode represented by the first load electrode 310. The transistor mesa sections 192 of the transistor cells TC include source regions 110. Between the drift and body regions 120, 115a the transistor cells TC are devoid of barrier regions or other regions of the first conductivity type having a higher impurity concentration than the drift region 120. The auxiliary cells AC are devoid of source regions or other regions of the first conductivity type between the first surface 101 and the charge carrier transfer regions 115. The idle cells IC may be devoid of any of the regions of the auxiliary and transistor cells AC, TC and/or are not connected to the first load electrode 310 such that they are neither effective as auxiliary cells AC nor as transistor cells TC.

Auxiliary mesa sections 194 adjoining control structures 180 include buried barrier regions 117 that extend over the complete lateral cross-sectional areas of the auxiliary mesa sections 194. At least such idle control structures 190 that adjoin the transistor cells TC may be electrically connected to the emitter potential to reduce feedback effects of a high current on the gate potential during IGBT switching.

Figure 4D:
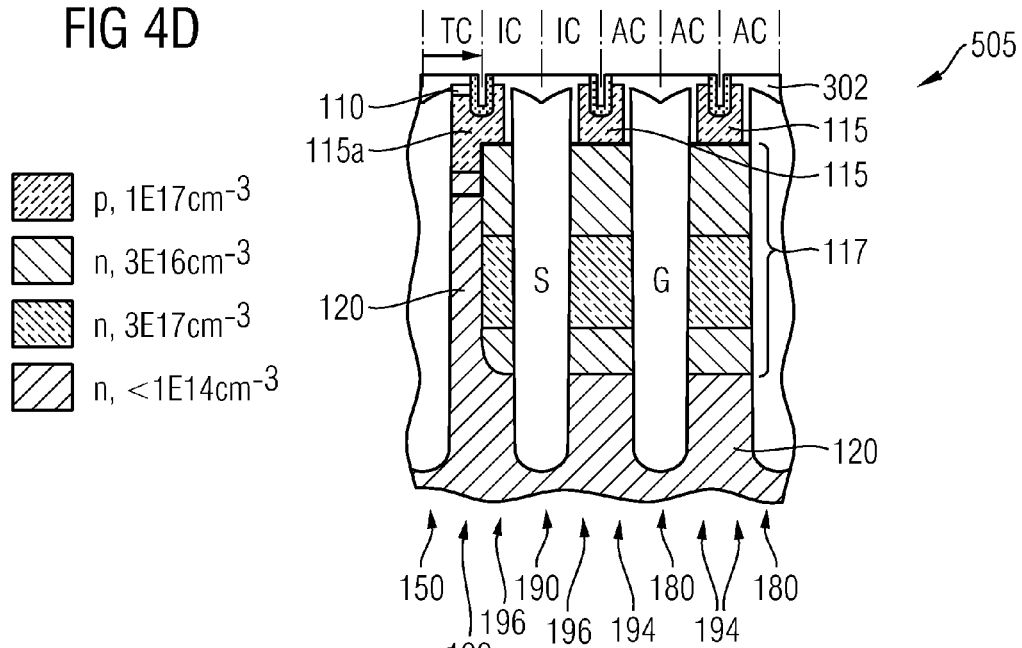
FIG. 4D is a schematic cross-sectional view of a portion of an RC-IGBT according to an embodiment providing collectively controllable auxiliary and transistor cells as well as idle cells.

FIG. 4D refers to a further RC-IGBT 505 with a transistor cell TC, idle cells IC and auxiliary cells AC. To avoid a huge hole injection in the mesa neighboring the transistor cell TC at 0 V, a half barrier region 117 may be implemented in the concerned mesa resulting in a transistor mesa section 192 oriented to the gate structure 150 and an idle mesa section 196 along the idle structure 190. In IGBTs that use shadowed regions in a lateral direction perpendicular to the cross-sectional plane to limit the short circuit current, a full buried region 170 may be implemented in the shadowed areas. The table gives the peak impurity concentrations in the body region 115a, sections of the barrier region 117 and the drift region 120.

Figure 4E:
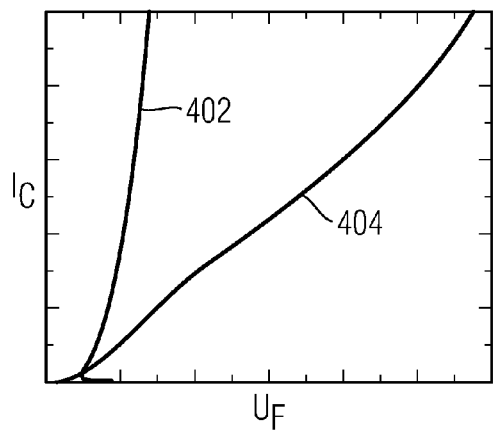
FIG. 4E is a schematic diagram showing the diode characteristics of the RC-IGBT of FIG. 4D in a reverse conducting mode at different gate voltages.

FIG. 4E schematically shows the diode characteristic 402 of the reverse conducting diode of the RC-IGBT 505 of FIG. 4D at $U_G=-15$ V and the diode characteristic 404 in the desaturation mode at a gate voltage $U_G=0$ V at an impurity dose in the n-type barrier region 117 of $3\times10^{12}$ (3E12) cm$^{-2}$. The significant increase of the forward voltage $U_F$ of the reverse diode at an increase of the gate voltage $U_G$ from $-15$ V to 0 V indicates a significant reduction of the charge carrier plasma in the drift region 120 and, as a consequence, a huge reduction of the reverse recovery charge.

Figure 4F:
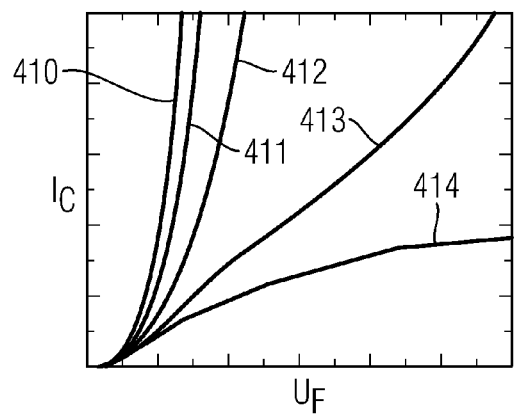
FIG. 4F is a schematic diagram showing the diode characteristics of the RC-IGBT of FIG. 4D in the reverse conducting mode at various implant doses for a barrier region.

FIG. 4F shows the diode characteristics 411-414 of the reverse conducting diode in the RC-IGBT 505 of FIG. 4D at an impurity dose for the barrier layer 170 of $1\times10^{13}$ (1E13) cm$^{-2}$, $2\times10^{13}$ (2E13) cm$^{-2}$, $3\times10^{13}$ (3E13) cm$^{-2}$ and $4\times10^{13}$ (4E13) cm$^{-2}$ at $U_G=0$ V. The diode characteristic 410 is that of a reference example without any barrier region 170. For a given load current, the collector-to-emitter voltage $U_{CE}$ increases with increasing impurity dose in the barrier region 170. An implant dose of the barrier region 170 adjusts the forward voltage $U_F$ and hence the reverse recovery charge.

FIG. 5A refers to a non-reverse conducting IGBT 506, i.e. an IGBT without integrated reverse conducting or freewheeling diode differing from the RC-IGBT 502 of FIGS. 3A and 3B in that the pedestal layer 130 forms a contiguous collector layer of the second conductivity type. The IGBT 506 includes transistor cells TC and auxiliary cells AC and may include idle cells IC as described above. A gate signal $U_G$ controls the transistor cells TC and a control signal $U_{CTR}$ controls the auxiliary cells AC. The emitter potential or any other internal potential not subject to the gate voltage $U_G$ and the control voltage $U_{CTR}$ may control the idle cells IC.

Figure 5B:
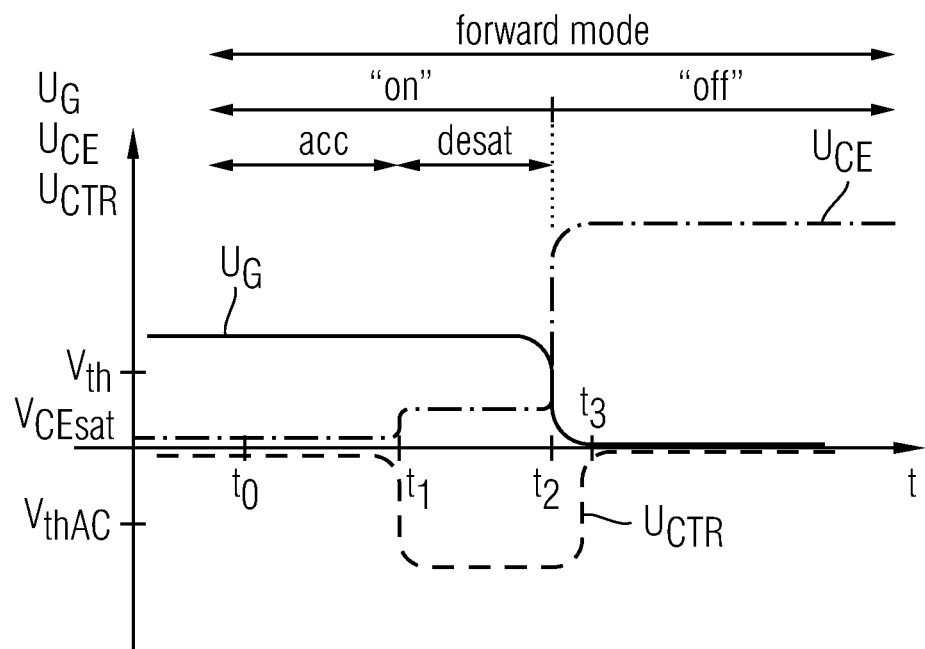
FIG. 5B is a schematic timing diagram illustrating a method of operating the non RC-IGBT of FIG. 5A.

FIG. 5B illustrates a method of operating the IGBT 506 of FIG. 5A at reduced switching losses.

During an on-state of the IGBT 506, the gate potential $U_G$ is above the threshold voltage $V_{th}$ of the transistor cells TC and an n-type inversion layer through the body regions 115a injects electrons into the drift region 120 in an accumulation period. The p-type pedestal layer 130 injects holes into the drift region 120 and a resulting dense charge carrier plasma ensures a low collector-to-emitter saturation voltage $V_{CEsat}$.

At t1, the voltage of the control signal $U_{CTR}$ is lowered below the first threshold voltage $V_{thAC}$ of the auxiliary cells AC to start a desaturation period. P-type inversion layers 184 along the control structure 180 extract holes from the drift region 120 through the charge carrier transfer regions 115 of the auxiliary cells AC to the first load electrode 310.

At t2, the voltage of the gate signal $U_G$ may fall below the threshold voltage $V_{th}$ of the transistor cells TC and the IGBT changes from the forward conducting state or on state to the forward blocking state or off state. During forward conduction the IGBT 506 is switched from a state with high carrier-confinement with low $V_{CEsat}$ and high $E_{off}$ to a state with low carrier-confinement with high $V_{CEsat}$ and low $E_{off}$ shortly before turn-off.

Typically the effective channel width of an IGBT is kept low in order to increase short circuit robustness such that active transistor cells TC are formed only in a portion of an active area of the IGBT 506. The auxiliary cells AC make use of a chip area which otherwise would be unused and do not require additional chip area.

In the IGBTs 507 to 510 of FIGS. 6A, 6C, 6D and 6E the same gate signal controls both the auxiliary cells AC and the transistor cells TC.

The non RC-IGBT 507 of FIG. 6A differs from the non RC-IGBT 506 of FIGS. 5A to 5B in that a constant voltage offset is applied between the control electrodes 159 of the transistor cells TC and the control electrodes 189 of the auxiliary cells AC. For example, a voltage shifter VS may be provided between the gate terminal G and a wiring line connecting the control electrodes 189. The RC-IGBT 506 may include a first semiconductor die with the semiconductor body 100 including the transistor and auxiliary cells TC, AC and a second semiconductor die including the voltage shifter VS. The semiconductor dies may be connected in a chip-on-chip technology. According to another embodiment the RC-IGBT 506 is a module including a printed circuit board or a carrier onto which two or more semiconductor dies are mounted, e.g., soldered.

According to another embodiment the IGBT 507 includes both a gate terminal G electrically connected to the gate electrodes 150 and a control terminal electrically connected to the control electrodes 189, wherein an external circuit applies a voltage-shifted version of the signal applied to the gate terminal G to the control terminal.

The offset voltage virtually shifts the threshold voltages of the auxiliary cells AC with regard to the gate potential applied to the gate electrodes. The virtually or actually shifted threshold voltages of the auxiliary cells AC allow the desaturation to be controlled by a three-level gate driver circuit integrated on the same semiconductor die as the IGBT or provided as a separate device whose output is electrically connected to the gate terminal G of the IGBTs 507 to 509 in FIGS. 6A, 6C, 6D.

The shifted threshold voltages of the auxiliary cells AC and the transistor cells TC are selected such that during an on state of the transistor cells TC the auxiliary cells AC may change from a non-inversion state without p-type inversion layers in the barrier and drift regions 117, 120 to an inversion state with p-type inversion layers in the barrier and drift regions 117, 120. According to an embodiment referring to n-channel IGBTs, the threshold voltage $V_{thAC}$ of the auxiliary cells AC is set above the threshold voltage $V_{th}$ of the transistor cells TC.

Figure 6B:
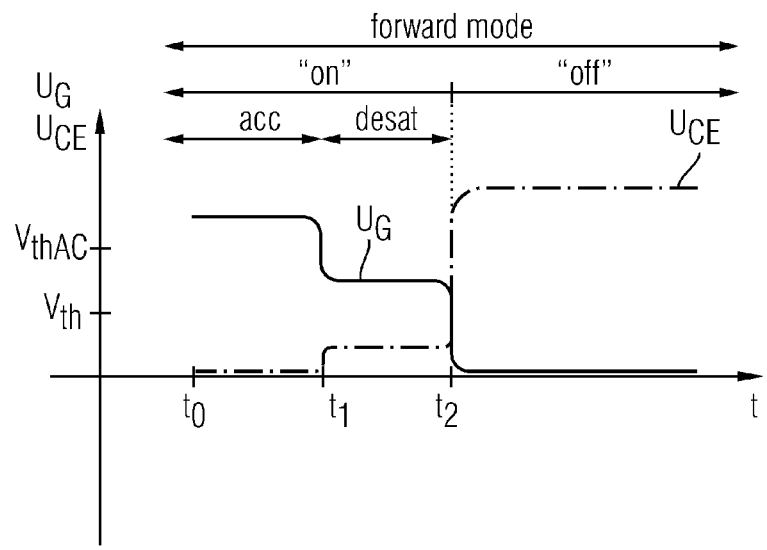
FIG. 6B is a schematic timing diagram for illustrating a method of operating the non RC-IGBT of FIG. 6A.

The timing diagram in FIG. 6B shows a high plasma density state or accumulation state between t0 and t1, when the voltage of the gate signal $U_G$ is above both the threshold voltage $V_{th}$ of the transistor cells TC and the threshold voltage $V_{thAC}$ of the auxiliary cells AC. In a desaturation period between t1 and t2 the voltage of the gate signal $U_G$ is below the threshold voltage $V_{thAC}$ of the auxiliary cells but above the threshold voltage $V_{th}$. The transistor cells TC remain in the on-state while p-type inversion layers around the control structures 180 of the auxiliary cells AC de-saturate the drift region 120. At t2 the voltage of the gate signal $U_G$ can directly transit from the voltage between the two threshold voltages $V_{th}$, $V_{thAC}$ to below the threshold voltage $V_{th}$, thereby switching off the transistor cells TC. The desaturation period reduces the charge in the drift region 120 right before the non RC-IGBT 507 of FIG. 6A is switched off. The desaturation significantly reduces switching losses.

Figure 6C:
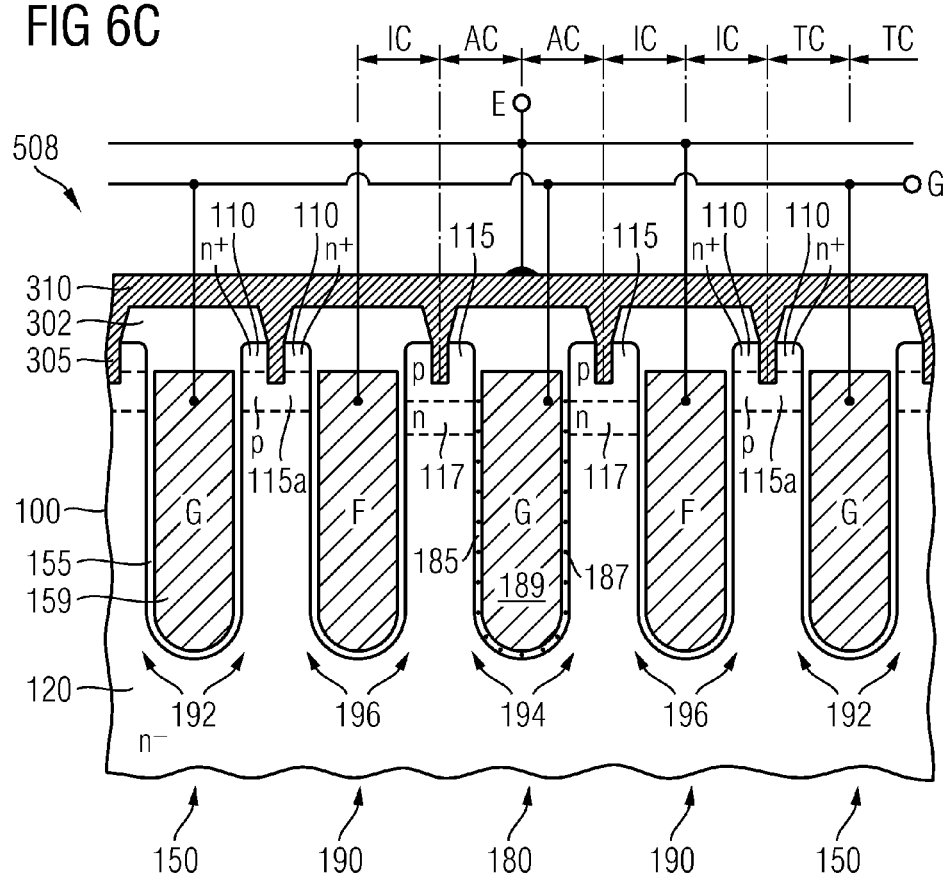
FIG. 6C is a schematic cross-sectional view of a portion of a semiconductor device in accordance with a further embodiment related to non RC-IGBTs with collectively controlled desaturation and transistor cells using control dielectrics containing fixed negative charges.
Figure 6D:
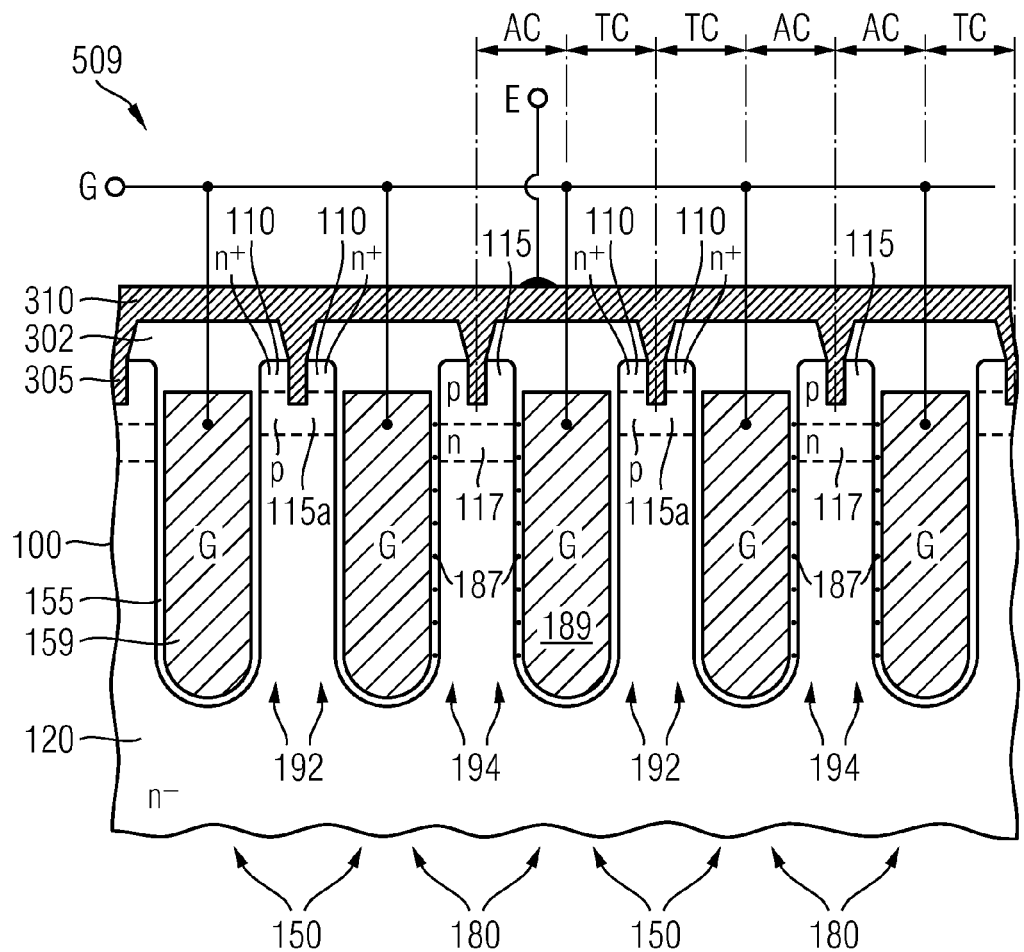
FIG. 6D is a schematic cross-sectional view of a portion of a non RC-IGBT with collectively controlled desaturation and transistor cells using control dielectrics containing fixed negative charges in accordance with a further embodiment related to alternatingly arranged desaturation and transistor cells.

In the IGBTs 508, 509 of FIGS. 6C, 6D, the control dielectrics 185 of the auxiliary cells AC and/or the gate dielectrics 155 of the transistor cells TC may contain fixed and stable charges, for example, resulting from x-ray irradiation, electron bombardment or a high dose implant at low energy using, e.g., PLAD (plasma doping, plasma immersion ion implantation). Irradiation and electron bombardment generate deep and stable charge carrier traps in the material of the concerned dielectric material. According to another embodiment aluminum atoms may be implanted or deposited through ALD (atomic layer deposition). An array concentration of the aluminum atoms/ions may be at least $5E11$ cm$^{-2}$, for example at least $1E12$ cm$^{-2}$, or may be in the range close to $5E12$ cm$^{-2}$, by way of example. Alternatively or in addition the control and gate electrodes 189, 159 may include different materials with different work functions with respect to the n-type semiconductor material.

In accordance with an embodiment, the control dielectrics 185 contain significantly more fixed and stable negative charges than the gate dielectrics 155 or the gate dielectrics 155 contain significantly more fixed and stable positive charges than the control dielectrics 185. According to an embodiment an area concentration of fixed and stable negative charges in the control dielectrics 185 is greater than $5E11$ cm$^{-2}$, for example $1E12$ cm$^{-2}$ or in the range of $5E12$ cm$^{-2}$.

In addition or alternatively, the gate electrodes 159 are based on a heavily doped polycrystalline silicon and/or the control electrodes 189 are based on a metal-containing material whose work function results in a considerable band bending in the semiconductor body 100 such that the actual threshold voltage $V_{thAC}$ of the auxiliary cells AC may be set to a value between the threshold voltage $V_{th}$ of the transistor cells TC, which may be about +5 V, and the maximum voltage available at the gate line, which may be +15 V. In typical applications the threshold voltage $V_{thAC}$ may be set to +12 V. A high conductive on-state or accumulation period at $U_G$=+15 V may be followed by a desaturation period of, e.g., 3 µs at $U_G$=10 V prior to a turn-off at $U_G$=0 V or lower, e.g., $U_G$=−15 V.

The IGBT 508 of FIG. 6C includes pairs of auxiliary cells AC, pairs of idle cells IC and pairs of transistor cells TC arranged in this order along at least one lateral direction. The cells of each cell pair are arranged mirror inverted to each other with respect to a vertical axis through the respective control or gate structure 150, 180, 190. The control dielectrics 189 contain stationary negative charges 187.

The IGBT 509 of FIG. 6D includes pairs of auxiliary cells AC and pairs of transistor cells TC arranged in this order along at least one lateral direction. The cells of each cell pair are arranged mirror inverted to each other with respect to a vertical axis through the respective auxiliary or transistor mesa section 192, 194. The control dielectrics 185 contain fixed stationary charges.

The embodiment of FIG. 6E refers to an internal control of the desaturation period. For example, the gate electrodes 159 of the transistor cells TC may be electrically connected to a gate wiring line or node 152 and the control electrodes 189 of the auxiliary cells AC may be electrically connected to a control wiring line or node 182. The control wiring line 182 may be directly connected to the gate terminal G. A low-pass circuit between the gate terminal G and the gate wiring line 152 may delay the signal applied to the gate electrodes 159 with respect to the signal applied to the control electrodes 189. The delay defined by the low-pass circuit defines the length of the desaturation period t2-t1 of FIG. 6B. The low-pass circuit may consist of or include a serial resistor R between the gate wiring line 152 and the gate terminal G.

Figure 7:
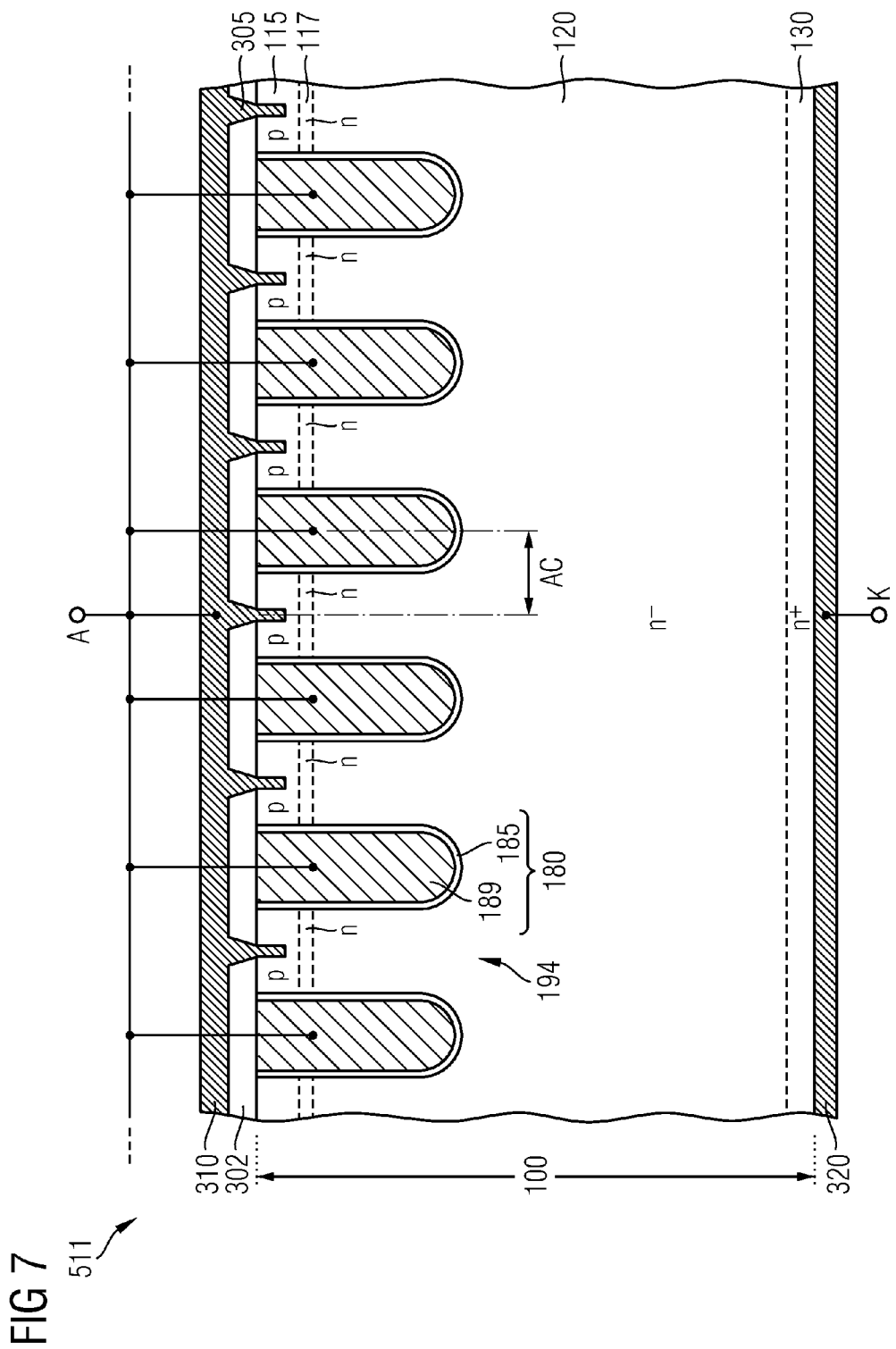
FIG. 7 is a schematic cross-sectional view of a portion of a semiconductor diode in accordance with an embodiment providing uncontrolled auxiliary cells.

The semiconductor diode 511 of FIG. 7 distinguishes from the semiconductor diode 501 of FIG. 2A in that the control electrodes 189 are electrically connected to a fixed potential, for example to the first load electrode 310. The barrier regions 117 allow the effective anode doping to be increased without increasing the charge carrier plasma in the semiconductor body during normal forward conduction. The control structures 180 may shape the electric field in the mesa portions in a suitable way.

In FIG. 8 a non-desaturable, non RC-IGBT 512 includes idle auxiliary cells AC whose control electrodes 195 are electrically connected to a fixed potential, for example with the first load electrode 310. In the case of a sufficient high impurity concentration in the barrier regions 117, the idle auxiliary cells AC are inactive in the IGBT mode. On the other hand, more contact structures 305 directly connect the first load electrode 310 with the semiconductor body 100 such that a thermal coupling between the semiconductor body 100 and the first load electrode 310 is significantly increased with regard to conventional devices that typically do not provide any contact structures to the semiconductor regions of idle cells. The thermal behavior of the non-saturable non RC-IGBT 512 can be better adjusted to its electrical performance.

FIGS. 9A to 9D refer to the arrangement of auxiliary cells in semiconductor diodes as discussed above, e.g., with reference to FIG. 2A and FIG. 7.

Figure 9A:
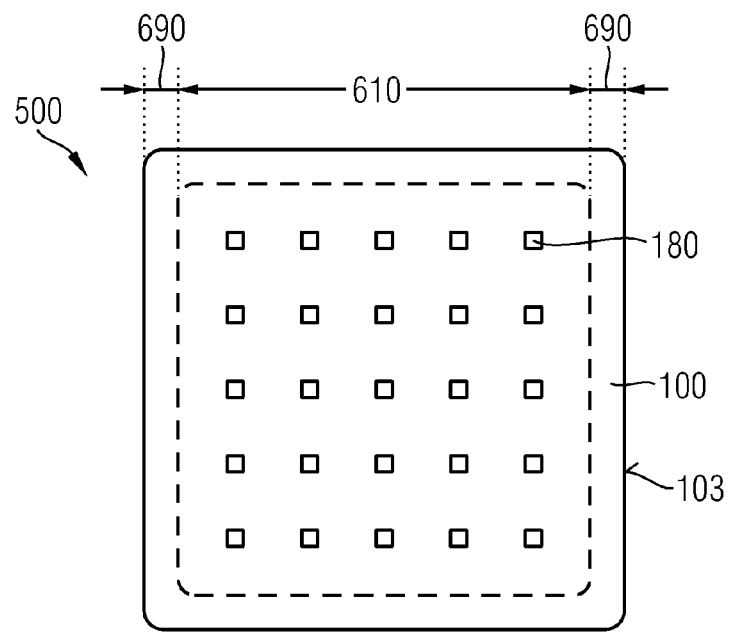
FIG. 9A is a schematic plan view of a semiconductor body of a semiconductor diode according to an embodiment providing evenly distributed compact control structures for auxiliary cells.

FIG. 9A shows compact control structures 180 of auxiliary cells AC with both lateral dimensions being significantly smaller than the corresponding lateral dimensions of an active area 610 of a semiconductor body 100 of the semiconductor device 500. The semiconductor body 100 includes an active area 610 and an edge area 690 between the active area 610 and an outer surface 103 of the semiconductor body 100. The edge area 690, which may include a termination structure and which is devoid of any charge carrier transfer region, surrounds the active area 610, which includes the charge carrier transfer regions. The compact control structures 180 may be arranged in regularly spaced lines and columns oriented along the edges or along the diagonals of the rectangular semiconductor body 100.

A population density of the control structures 180 may be homogenous across the whole active area 610. According to other embodiments, the population density may be sparser in a central portion of the active area 610 and may be denser in an outer portion of the active area 610 adjoining the edge area 690 to extract charge carriers flooded into the edge area 690. Alternatively or in addition to a lateral variation of the control structure population density, the impurity dose of the barrier regions may be varied along one or two lateral axes. For example, the impurity dose of barrier regions in the outer portion may be higher than in a central portion to improve commutation ruggedness. Alternatively or in addition, the active area 610 may include auxiliary cells without barrier regions, wherein a ratio of auxiliary cells with barrier region to auxiliary cells without barrier region increases with decreasing distance to the edge area 690.

Figure 9B:
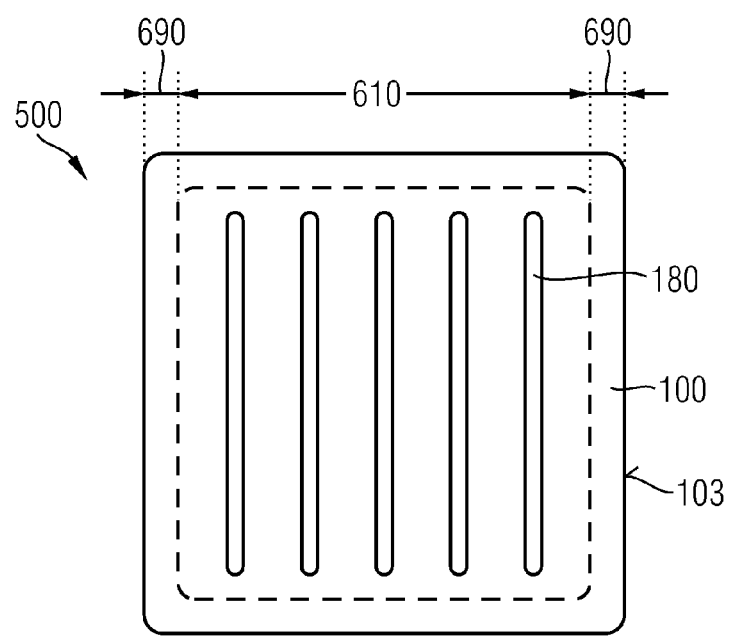
FIG. 9B is a schematic plan view of a semiconductor body of a semiconductor diode according to an embodiment providing stripe-shaped control structures for auxiliary cells.

FIG. 9B shows stripe-shaped control structures 180 of stripe-shaped auxiliary cells arranged at a regular center-to-center distance (pitch) and oriented along one of the outer edges of the semiconductor body 100.

Figure 9C:
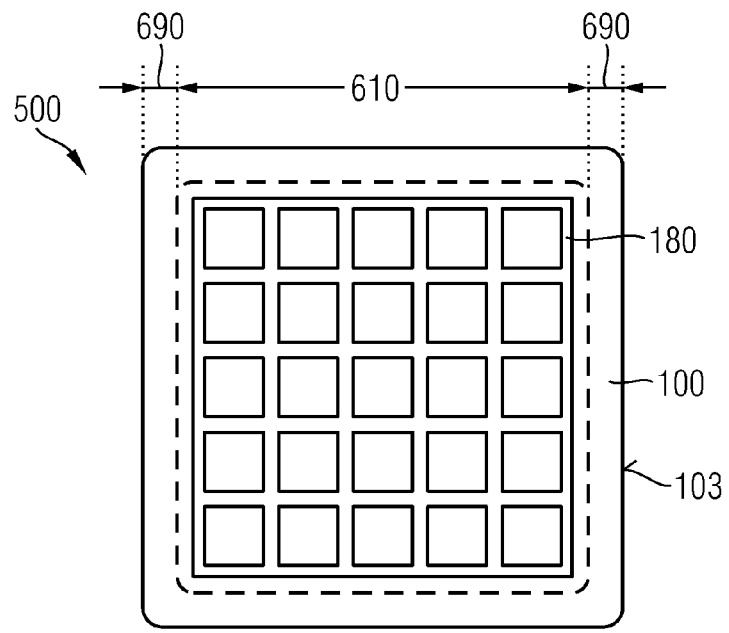
FIG. 9C is a schematic plan view of a semiconductor body of a semiconductor diode according to an embodiment providing a grid-shaped control structure for an auxiliary cell.

FIG. 9C shows a grid-shaped cell control structure 180 of a grid-shaped auxiliary cell with a plurality of sub-portions of the charge carrier transfer region 115 formed in the meshes. The size of the meshes may be homogenous across the whole active area 610 or may decrease with decreasing distance to the edge area 690.

Figure 9D:
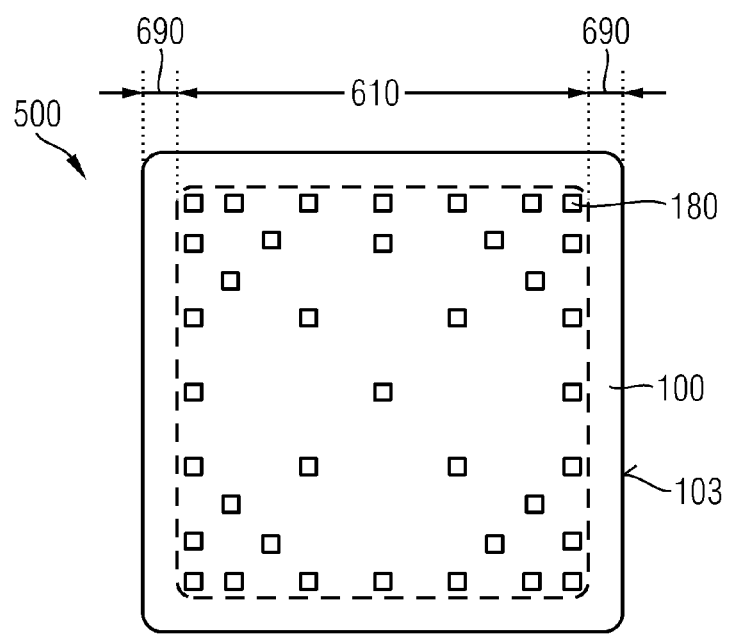
FIG. 9D is a schematic plan view of a semiconductor body of a semiconductor diode according to an embodiment providing unevenly distributed compact control structures for auxiliary cells.

In FIG. 9D compact control structures 180 of auxiliary cells AC are arranged at a lower population density in a central portion of the active area 610 and at a higher population density in an outer portion of the active area 610 oriented to the edge area 690.

FIGS. 10A to 10D refer to the arrangement of transistor cells and auxiliary cells for IGBTs including RC-IGBTs.

Figure 10A:
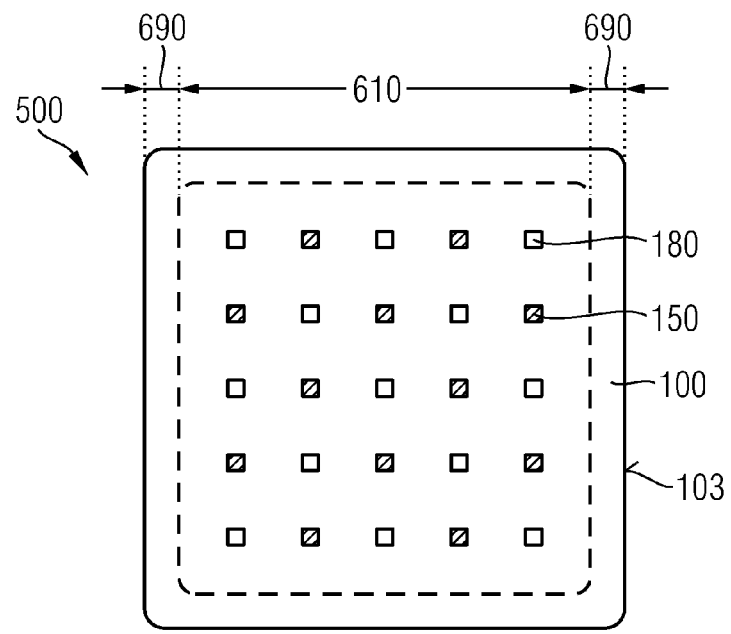
FIG. 10A is a schematic plan view of a semiconductor body of a semiconductor device according to an embodiment including evenly distributed compact control structures for auxiliary and gate structures for transistor cells.

FIG. 10A refers to an arrangement of gate structures 150 of transistor cells and control structures 180 of auxiliary cells in a regular, matrix-like pattern in equally spaced lines and columns. Along each line and along each column the control structures 180 and gate structures 150 may be alternatingly arranged. Apart from the outermost auxiliary and transistor cells, each gate structure 150 may adjoin four control structures 180 and vice versa. The arrangement may be similar to a checker board pattern with the gate structures 150 assigned to the white fields and the control structures 180 assigned to the black fields. According to other embodiments, the outermost lines and columns adjoining the edge area 690 may include more auxiliary cells than transistor cells to support the desaturation of the edge area 690. Alternatively or in addition to a lateral variation of the control structure population density, the impurity dose of the barrier regions in the auxiliary cells may be varied along one or two lateral axes as described with regard to FIG. 9A. In addition or alternatively, the population density of the transistor cells TC along the edge area 690 may be lower than in a central portion of the active area 610.

Figure 10B:
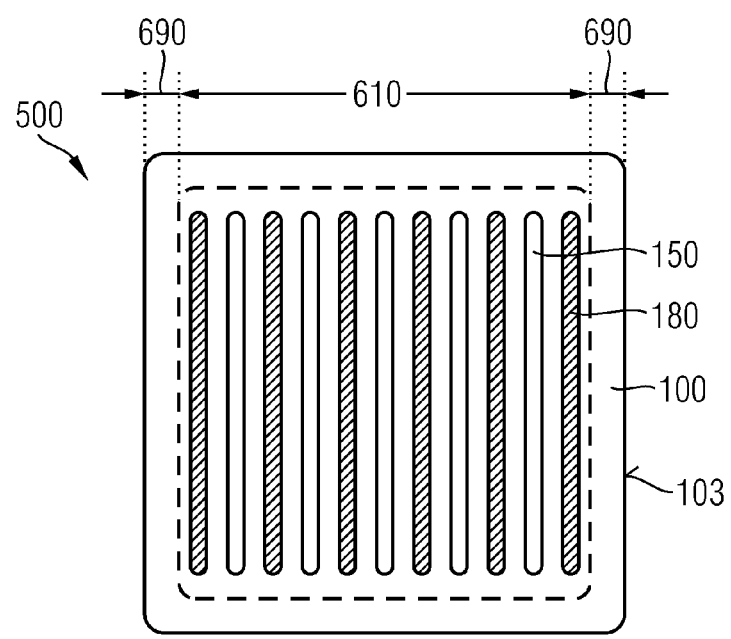
FIG. 10B is a schematic plan view of a semiconductor body of a semiconductor device according to an embodiment including regularly arranged control structures for auxiliary and gate structures for transistor cells.

FIG. 10B refers to stripe-shaped gate and control structures 150, 180, which may extend parallel to one of the edges of the semiconductor body 100 and which may be arranged at regular pitches.

Figure 10C:
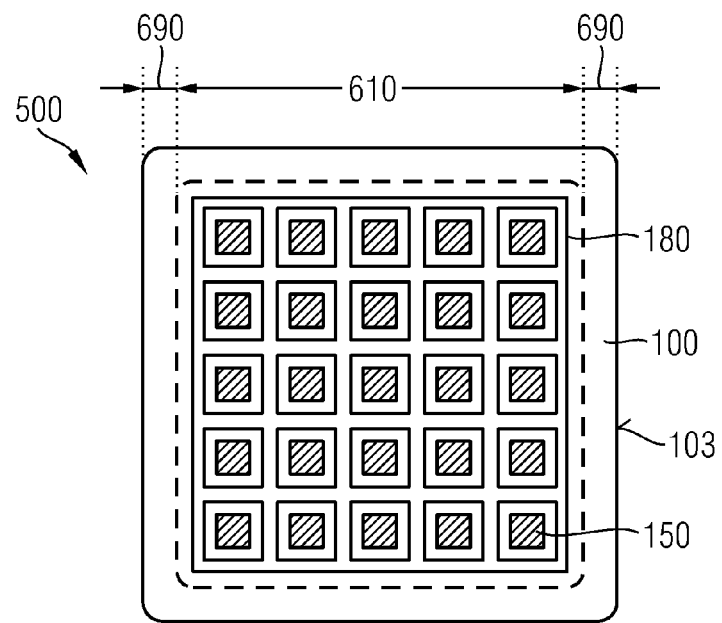
FIG. 10C is a schematic plan view of a semiconductor body of a semiconductor device according to an embodiment including a grid-shaped control structure for an auxiliary cell and transistor cells formed in the meshes of the desaturation cell.

FIG. 10C shows a control structure 180 forming a grid with the transistor cells and the gate structures 150 arranged in the meshes. Another embodiment may provide the inverted pattern with a transistor cell forming the grid and the auxiliary cells formed in the meshes of the grid.

Figure 10D:
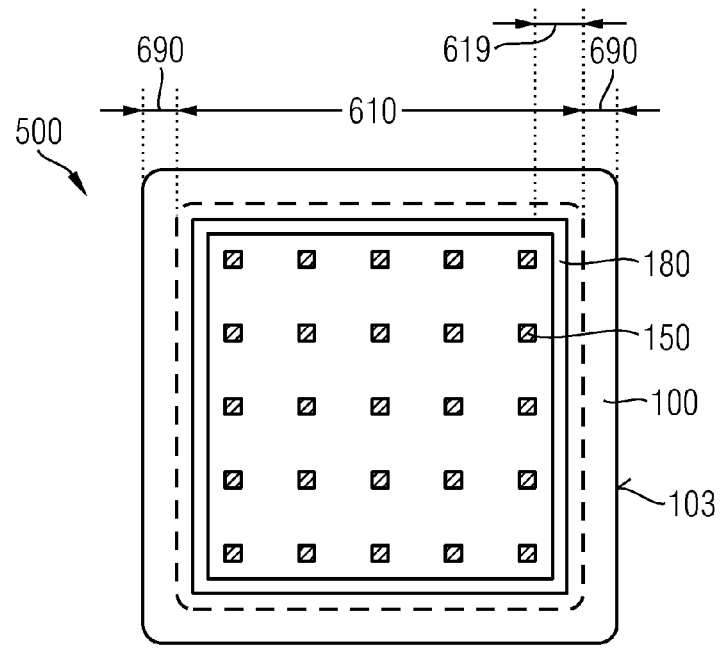
FIG. 10D is a schematic plan view of a semiconductor body of a semiconductor device according to an embodiment including a frame-like control structure for an auxiliary cell and evenly distributed compact gate structures for transistor cells.

FIG. 10D shows regularly arranged gate structures 150 of compact transistor cells in a central portion of the active area 610 and a frame-like control structure 180 of an auxiliary cell arranged in an outer portion 619 of the active area 610 oriented to the edge area 690.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
a barrier region sandwiched between a drift region and a charge carrier transfer region, the barrier and charge carrier transfer regions forming a pn junction and the barrier and drift regions forming a homojunction, wherein an impurity concentration in the barrier region is at least ten times as high as an impurity concentration in the drift region; and
a control structure configured to form an inversion layer in the drift and barrier regions in an inversion state and to form no inversion layer in the drift and barrier regions in a non-inversion state.

2. The semiconductor device of claim 1, wherein
the semiconductor device is configured not to form, through the charge carrier transfer region, a path for minority charge carriers in an inversion layer along the control structure between the drift region and a load electrode.

3. The semiconductor device of claim 1, wherein
the control structure extends from a first surface of a semiconductor body comprising the charge carrier transfer region into the semiconductor body down to at least the drift region, and
the charge carrier transfer region directly adjoins the first surface at the control structure.

4. The semiconductor device of claim 1, wherein
the control structure extends from a first surface of a semiconductor body comprising the charge carrier transfer region into the semiconductor body down to at least the drift region, and
the control structure comprises a control electrode, a control dielectric sandwiched between the barrier and drift regions on a first side and the control electrode at a second side opposite to the first side, and a top dielectric between the first surface and the control electrode overlaps the charge carrier transfer region in a vertical direction perpendicular to the first surface.

5. The semiconductor device of claim 1, wherein
the semiconductor device is a semiconductor diode comprising a cathode layer of a conductivity type of the drift and barrier regions between the drift region and a second surface of the semiconductor body opposite to the first surface.

6. The semiconductor device of claim 1, wherein
the semiconductor device is an insulated gate bipolar transistor comprising a field effect transistor cell.

7. The semiconductor device of claim 1, wherein
the semiconductor device is a reverse conducting insulated gate bipolar transistor comprising a collector layer comprising first zones of a first conductivity type and second zones of a second conductivity type complementary to the first conductivity type between the drift region and a second surface of the semiconductor body opposite to the first surface.

8. The semiconductor device of claim 1, wherein
the semiconductor device is a non-reverse conducting insulated gate bipolar transistor comprising a collector layer between the drift region and a second surface of the semiconductor body opposite to the first surface, wherein the collector layer has a second conductivity type complementary to a first conductivity type of the drift region.

9. The semiconductor device of claim 6, wherein
the transistor cell comprises a body region forming pn junctions with a source region and the drift region, and a gate structure configured to form an inversion layer in the body region during an on state and to form no inversion layer in the body region outside the on state of the transistor cell.

10. The semiconductor device of claim 9, wherein
the control structure comprises a control electrode and a control dielectric between the barrier and drift regions on a first side and the control electrode at a second side opposite to the first side,
the gate structure comprises a gate electrode and a gate dielectric between the body region on a first side and the gate electrode at a second side opposite to the first side, and
the gate and control structures are electrically connected to each other.

11. The semiconductor device of claim 9, wherein
a voltage higher than a first threshold voltage at the gate and control structures induces the on state,
a voltage lower than a second threshold voltage, which is lower than the first threshold voltage, induces the inversion state, and
a voltage between the first and second threshold induces neither the on state nor the inversion state.

12. The semiconductor device of claim 9, wherein
a voltage higher than a first threshold voltage at the gate and control structures induces the on state, a voltage lower than a second threshold voltage, which is higher than the first threshold voltage, induces the inversion state, and a voltage higher than the second threshold voltage induces the non-inversion state.

13. The semiconductor device of claim 10, wherein the gate and control dielectrics are provided from different materials and/or the gate and control electrodes are formed from different materials such that a first threshold voltage of the transistor cell is equal to or lower than a second threshold voltage of the auxiliary cell.

14. The semiconductor device of claim 10, wherein the control dielectric contains fixed negative charges and/or a work function of a material of the control electrode with respect to the semiconductor body is higher than a work function of a material of the gate electrode.

15. The semiconductor device of claim 10, further comprising:
a voltage shifter configured to apply a voltage to the control electrodes that deviates from a voltage applied to the gate electrodes by a predefined voltage offset, wherein the voltage offset is greater than a difference between the first and second threshold voltages.

16. The semiconductor device of claim 1, further comprising:
a plurality of auxiliary cells, each auxiliary cell comprising one of the control structures, wherein
a population density of the auxiliary cells in a central region of an active area is higher than in an outer region of the active area oriented to an edge area devoid of auxiliary cells.

17. The semiconductor device of claim 1, wherein the barrier region contains impurities of a deep level donor or deep double donor.

18. An insulated gate bipolar transistor, comprising:
a transistor cell; and
an auxiliary cell comprising a barrier region sandwiched between a drift region and a charge carrier transfer region, the barrier and charge carrier transfer regions forming a pn junction and the barrier and drift regions forming a homojunction, wherein an impurity concentration in the barrier region is at least ten times as high as an impurity concentration in the drift region.

19. The insulated gate bipolar transistor of claim 18, wherein
a control structure of the auxiliary cell comprises a control electrode and a control dielectric between the barrier and drift regions on a first side and the control electrode at a second side opposite to the first side, and
the control electrode is electrically connected to a fixed potential with respect to a load electrode.

20. A semiconductor diode, comprising:
a control structure extending from a first surface into a semiconductor body, the control structure comprising a control electrode and a control dielectric between the semiconductor body on a first side and the control electrode at a second side opposite to the first side; and
a barrier region sandwiched between a drift region and a charge carrier transfer region in the semiconductor body, the barrier and charge carrier transfer regions forming a pn junction and the barrier and drift regions forming a homojunction, wherein an impurity concentration in the barrier region is at least ten times as high as an impurity concentration in the drift region.

* * * * *